US008840700B2

(12) United States Patent
Shearer et al.

(10) Patent No.: US 8,840,700 B2
(45) Date of Patent: *Sep. 23, 2014

(54) PREPARATION OF METALLURGIC NETWORK COMPOSITIONS AND METHODS OF USE THEREOF

(75) Inventors: Catherine Shearer, San Marcos, CA (US); Kenneth C. Holcomb, San Diego, CA (US); G. Delbert Friesen, Huntington Beach, CA (US); Michael C. Matthews, Encinitas, CA (US)

(73) Assignee: Ormet Circuits, Inc., San Diego, CA (US)

( * ) Notice: Subject to any disclaimer, the term of this patent is extended or adjusted under 35 U.S.C. 154(b) by 664 days.

This patent is subject to a terminal disclaimer.

(21) Appl. No.: 12/940,203

(22) Filed: Nov. 5, 2010

(65) Prior Publication Data

US 2011/0171372 A1  Jul. 14, 2011

Related U.S. Application Data

(60) Provisional application No. 61/258,365, filed on Nov. 5, 2009.

(51) Int. Cl.
| | | |
|---|---|---|
| B22F 1/00 | (2006.01) | |
| B23K 35/22 | (2006.01) | |
| B22F 3/10 | (2006.01) | |
| C22C 1/04 | (2006.01) | |
| H01B 1/02 | (2006.01) | |

(52) U.S. Cl.
CPC .. *H01B 1/02* (2013.01); *B22F 3/10* (2013.01); *C22C 1/0483* (2013.01); *H01B 1/026* (2013.01); *C22C 1/0491* (2013.01); *C22C 1/0425* (2013.01)
USPC .................. 75/255; 75/252; 148/24; 228/244; 228/248.1

(58) Field of Classification Search
USPC ......... 75/252, 255; 428/558, 559; 148/24, 25, 148/26; 252/512; 228/248.1, 244
See application file for complete search history.

(56) References Cited

U.S. PATENT DOCUMENTS

| | | | |
|---|---|---|---|
| 5,043,102 A | 8/1991 | Chen et al. | |
| 5,088,189 A | 2/1992 | Brown | |
| 5,376,403 A | 12/1994 | Capote et al. | |
| 5,463,190 A | 10/1995 | Carson et al. | |
| 5,565,267 A | 10/1996 | Capote et al. | |
| 5,639,556 A | 6/1997 | Gaumet | |
| 5,716,663 A | 2/1998 | Capote et al. | |
| 5,830,389 A | 11/1998 | Capote et al. | |
| 5,853,622 A | 12/1998 | Gallagher et al. | |
| 5,922,397 A | 7/1999 | Brandt et al. | |
| 5,948,533 A | 9/1999 | Gallagher et al. | |
| 5,980,785 A | 11/1999 | Xi et al. | |
| 6,054,761 A | 4/2000 | McCormack et al. | |
| 6,068,782 A | 5/2000 | Brandt et al. | |
| 6,085,415 A | 7/2000 | Gandhi et al. | |
| 6,114,413 A | 9/2000 | Kang et al. | |
| 6,127,619 A | 10/2000 | Xi et al. | |
| 6,132,646 A | 10/2000 | Zhou et al. | |
| 6,139,777 A | 10/2000 | Omoya et al. | |
| 6,143,116 A | 11/2000 | Hayashi et al. | |
| 6,207,259 B1 | 3/2001 | Iino et al. | |
| 6,297,559 B1 | 10/2001 | Call et al. | |
| 6,337,522 B1 | 1/2002 | Kang et al. | |
| 6,370,013 B1 | 4/2002 | Iino et al. | |
| 6,716,036 B2 | 4/2004 | Gandhi | |
| 6,896,172 B2 * | 5/2005 | Taguchi et al. | 228/180.1 |
| 7,022,266 B1 | 4/2006 | Craig | |
| 7,214,419 B2 | 5/2007 | Umeda et al. | |
| 8,221,518 B2 * | 7/2012 | Shearer et al. | 75/252 |
| 2001/0044590 A1 | 11/2001 | Ceriani et al. | |
| 2002/0051728 A1 | 5/2002 | Sato et al. | |
| 2004/0265608 A1 | 12/2004 | Pecorini et al. | |
| 2008/0023665 A1 | 1/2008 | Weiser et al. | |
| 2008/0207814 A1 | 8/2008 | Wrosch et al. | |
| 2009/0155608 A1 | 6/2009 | Nomura et al. | |
| 2010/0252616 A1 | 10/2010 | Shearer et al. | |

FOREIGN PATENT DOCUMENTS

| | | |
|---|---|---|
| JP | 53-133799 | 11/1978 |
| JP | 03187373 | 7/2001 |
| WO | 9839105 | 9/1998 |
| WO | 0059645 | 10/2000 |
| WO | 2010114874 A3 | 10/2010 |
| WO | WO-2010114874 | 10/2010 |
| WO | 2011078918 A2 | 6/2011 |
| WO | 2011078918 A3 | 10/2011 |

\* cited by examiner

*Primary Examiner* — George Wyszomierski
*Assistant Examiner* — Ngoclan T Mai
(74) *Attorney, Agent, or Firm* — The Law Office of Jane K. Babin, Professional Corporation; Jane K. Babin

(57) ABSTRACT

The present invention provides conductive metal compositions for electronic applications, and methods of preparation and uses thereof. More specifically, the present invention provides metallic particle transient liquid phase sintering compositions containing blended formulations of metal and metal alloy components that form interconnected conductive metallurgical networks with increased stability, resistance to thermal stress and ability to mitigate CTE mismatch between materials.

35 Claims, 8 Drawing Sheets

PREPARATION OF METALLURGIC NETWORK COMPOSITIONS AND METHODS OF USE THEREOF

RELATED APPLICATIONS

This application claims the benefit of priority under 35 USC §119 of U.S. Provisional Application Ser. No. 61/258,365 filed, Nov. 5, 2009, the entire disclosure of which is incorporated herein by reference.

FIELD OF THE INVENTION

The present invention relates to metal compositions, methods of preparation and uses thereof. More specifically, the present invention relates to metallic transient liquid phase sintering compositions containing blended formulations of metal and metal alloy components that form interconnected conductive metallurgical networks with increased stability, resistance to thermal stress and ability to mitigate CTE mismatch between materials.

BACKGROUND OF THE INVENTION

Over the last few decades, the electronics industry has continually driven toward higher performance and functionality in smaller form factors. At the production level, these driving forces have translated into smaller circuit features, designs and manufacturing methods that support more efficient circuit routing, elimination of packaging layers and sophisticated engineered materials. However, progress has come at the cost: close juxtaposition of dissimilar materials has made it more difficult to manage thermo-mechanical stresses management and thermal transfer.

One trend in the design of printed circuit boards and semiconductor packaging has been to shift from a through-hole vertical interconnection architecture to a direct layer-to-layer interconnection architecture to optimize circuit routing for speed and performance. Ideally the conductive vias that interconnect layers of circuitry would be commensurate in size with the circuit traces that they interconnect, provide rugged and reliable conduction, require very small connecting circuit features, and could be stacked or otherwise placed freely anywhere in a circuit board or package design. It is cost prohibitive to plate solid metal vias to form such layer-to-layer interconnections and entrapment of plating solution is a significant issue. Instead, the topography of a via hole is frequently plated to a reasonable thickness. However, this strategy creates mechanical stress points at the edge of the via and at the point where plating connects with an underlying pad. The dimple created in the center of the via can also be a source of defects. Although via holes can be filled with conductive compounds, such via fill materials do not form electrically robust interfaces with copper pads.

In addition to miniaturization, there is an emerging trend toward integrating electronic devices or elements thereof directly into other objects. Full realization of this trend will require 3-D architectures and suitable manufacturing methods. Innovative interconnection strategies will be required for applications as diverse as interconnecting the I/Os of stacked semiconductor die, creating conformable or embedded antenna structures for wireless devices and creating collection grids on solar panels.

Increasingly, this trend has led to applications where dissimilar materials must be adhered together. Examples include attachment of components to circuit boards, and attachment of integrated circuits (ICs) to lead frames, redistribution layers and heat sinks. In many applications, thermal conduction between the adherands is at least as important as electrical conduction. The critical elements for a successful adhesive are the quality of the adhesive bond; the bulk electrical and thermal conductivity of the adhesive; the thermal, mechanical and electrical quality of the interfaces between the adhesive and the adherands; and the ability of the adhesive to mitigate differences in coefficient of thermal expansion of the adherands. Solder is often used to attach components to circuit boards, to adhere heat sinks to components, and to attach ICs to packages. Soldering a component to a heat sink or board/package generally requires high temperatures, and the surfaces to be joined must be wettable by the soldering material for adhesion to occur. In addition, the intermetallic and alloy phases of a soldered joint are not well matched to the coefficient of thermal expansion of the materials to be thermally connected, which results in high thermal mismatch stress. Repeated thermal cycling can cause microstructural coarsening, resulting in creep rupture. Gold-silicon and gold-tin are both gold-rich eutectic compositions that are used in high power semiconductor applications where conventional solders and adhesives do not have sufficient thermal conductivity. The major drawback for both of these materials is their very high cost. Also, compared to other lower temperature solders, both AuSn and AuSi have low ductility making CTE stress an issue, particularly at high die attach temperatures. The primary benefit of using solder as an electronic adhesive is the alloyed interfaces and high bulk thermal conductivity. The main detriments are the stress on the die from CTE mismatch and the complications for subsequent assembly operations.

Polymeric adhesives are a common alternative to solder because their mechanical characteristics can be tailored and because they do not require solderable adherands. The thermal conductivity (k) of pure polymer adhesives is generally poor (typically 0.2 to 0.3 W/m° K) and most polymer materials are electrical insulators. To increase the thermal and electrical conductivity of polymer adhesives, conductive filler particles can be added to an adhesive formulation. The primary advantage of thermally and electrically conductive adhesive compositions is that they are easily applied and processed resulting in nearly 100% coverage of the interface. The primary disadvantages are that the electrical/thermal interfaces as well as the bulk electrical/thermal conductivity are dependent upon particle-to-particle contact. At percolation threshold, an average of 1.5 contacts per particle is typical and these contacts are vulnerable to environmental degradation.

A further trend is the reduction and eventual elimination of environmental hazards and toxins, including volatile organic compounds and lead. The elimination of once ubiquitous lead, in particular has complicated electronic device manufacture. The industry has coalesced around high tin alloys as a replacement for tin-lead. High tin alloys have melting temperatures roughly 30° C. higher than the tin-lead alloys that they replace, resulting in commensurate increases in component assembly process temperatures, which can increase thermo-mechanical stresses on increasingly fine-featured electrical interconnects.

As semiconductor packaging and printed circuit board production converge, substantial engineering effort has been devoted to creating materials than can withstand the rigors of the new architectures and processing regimes. For example, the microstructure of copper foil used to produce the fine circuits has become highly controlled. Composite laminates that are used to create circuit substrates have undergone extensive product development to control flow characteristics, glass transition temperature, coefficient of thermal expansion, and high quality hole formation. Surface preparation chemistries and primer coatings have also been extensively characterized and optimized. Barrier metals and surface finishes are now applied to strict tolerances; dopants are now added to the mechanical characteristics of solder joints and prevent undesirable microstructures such as tin whiskers from forming.

Despite these measures, there remains a need for inexpensive, robust, low process temperature and reliable electrical and thermal interconnection strategies for critical junctions within electronic devices.

TLPS

Transient liquid phase sintering (TLPS) materials were introduced nearly two decades ago as a reliable and versatile conductive paste solution to printed circuit board interconnection challenges. Primarily lead-based alloys were blended with copper particles in a fluxing binder. The compositions could be processed like conventional lead-tin solders and formed robust metallurgical junctions to solder wettable surfaces. Unlike solder, however, TLPS compositions created a metal "thermoset" during processing, such that TLPS paste materials could be used on or in circuit boards, and in operations where step soldering was typically required, and the processed composition would not remelt at the original process temperature.

The requirements for these early TLPS materials were that they metallurgically react to form a electrically conductive interconnections, remain solid through subsequent thermal processing, self-inert, and provide a reasonably solderable surface. The microstructure of the metal network formed and the surrounding organic matrix were optimized only to the extent that characteristics such electrical conductivity and adhesion were improved. The size of the interconnections was relatively large and the processed TLPS materials were rarely subjected to subsequent thermal excursions in excess of 220° C.

Early TLPS materials relied heavily on lead due to its low process temperature, excellent wetting of copper, reasonably good electrical and thermal conductivity, and ductile, predominantly lead, bridges between copper-tin intermetallic sheathed copper particles in the cured TLPS composition. The elimination of lead presented significant challenges to realizing the potential of TLPS technology.

TLPS compositions have been used as replacements for conventional electrically and/or thermally conductive materials in a wide variety of applications including assembly of electronic components, in-plane circuit traces, interconnection of circuit traces on different planes, assembly of unpackaged integrated circuit die onto packaging elements, and the like. See U.S. Pat. Nos. 6,716,036; 5,980,785; 5,948,533; 5,922,397; 5,853,622; 5,716,663 and 5,830,389, the contents of which are incorporated herein by reference in their entireties.

To meet the increasing demands of modern electronic packaging, TLPS interconnect materials must be carefully engineered as application-specific composites. Desired properties in TLPS materials include those listed in Table 1.

TABLE 1

Desirable Properties of TLPS Materials

Form interconnected metallurgical networks
Processing at temperatures below 250° C.
High specificity of metallurgical component selection
High tolerance to thermo-mechanical stress TABLE 1-continued Desirable Properties of TLPS Materials Thermally stable bulk and interfacial electrical and thermal resistance
Preferably lead-free
Include an interpenetrating organic network that is application specific to the adherands and surrounding materials In addition, TLPS pastes can be useful as adhesives in the electronics industry. By incorporating traditional polymer-based adhesive components with a reactive metallurgy, a thermosetting polymer network can be formed that interpenetrates and reinforces the TLPS metallic network. During TLPS processing of the typical particles of elemental copper and tin alloy at process temperature typically below 200° C., the alloy particles melt and essentially "microsolder" the copper particles into a network structure. When TLPS material is in contact with solderable surfaces, these surfaces are also wet by the alloy powder to create alloyed interfaces. Unlike the laminar interface that solder materials form, the interface between the TLPS material and the solderable surface is composed of a matrix of organic adhesive and microsolder joints.

While this technology is promising for electronic adhesive applications, it does suffer from some serious limitations. The bismuth typically used to create a low-process-temperature alloy is an extremely poor thermal conductor and is brittle. Consequently, the intermetallics formed during the creation of the metallic network are brittle and poorer conductors than the core metals used. Unfortunately the metallic matrix formed with TLPS tends to dominate the mechanical characteristics of the processed adhesive, thereby limiting the ability to tailor the organic matrix to mitigate the CTE mismatch stress.

Therefore, there exists a need in the field of electronic adhesives for improved adhesive material that simultaneously provides high bulk thermal and electrical conductivity, low and stable interfacial thermal and electrical resistance, high adhesive strength, and the ability to mitigate stress caused by differences in coefficient of thermal expansion of the adherands.

SUMMARY OF THE INVENTION

The present invention provides particle mixtures composition containing:
  A. between about 35 mass % and about 60 mass % of a first metallic particle component including a first metal, based on the total mass of metal particles in the composition; and
  B. a second metallic particle component including a second metal that forms intermetallic species with the first metal at temperature $T_1$, where the intermetallic species have a minimum melting temperature not less than 10° C. above $T_1$.

Within such particle mixtures, the second metallic particle component includes an excess of the second metal over the amount required to completely convert all of the first metal to the intermetallic species, and the second metallic particle component includes at least about 10 mass % of an alloy of the second metal and a carrier, where the alloy is molten at $T_1$. For example, the carrier can be Bi and the intermetallic can include Sn and Cu, Sn and Ag, or Sn and a combination of Cu and Ag.

The first metal can be Cu, Ag, Au, Pt, Ir, Os, Pd, Pt, Ph, Ru, Ga, In, Al, Re, Zn, Ni, Sn, Bi, Sb or a combination thereof. Typically, the first metal is selected from Cu, Ag, Au, Pt, In, Ga and combinations thereof. Often the first metal is copper, a noble metal, or a combination thereof.

The second metal can Sn, Bi, Pb, Cd, Zn, Ga, In, Te, Hg, Tl, Sb, Se, Po or a combination thereof. In certain aspects, second metal is selected from Sn, Bi, Pb, Ga, In, Zn and combinations thereof. In yet further aspects, the particle mixture is free of lead.

Particularly, the second metallic particle component may further include at least one additional alloy of the second metal with the proviso that the at least one additional alloy is either molten at $T_1$ or is soluble in the first alloy at $T_1$. In some embodiments, the second metallic particle component includes a plurality of alloys of the second metal, each of which is either molten at $T_1$ or is soluble in another molten alloy at $T_1$.

The process temperature $T_1$ for the composition of the invention typically does not exceed 260° C. In certain embodiments, $T_1$ is in the range of about 135° C. to 220° C.

Exemplary particle mixtures of the invention include first metal that is comprises Cu and a second metal that comprises Sn. In certain aspects, the first metal also comprises Ag. The carrier can be, for example, Bi and the intermetallic species can Sn—Cu intermetallics, Sn—Ag intermetallics or both.

In some aspects of the invention, the composition can include a metal additive, such as B, Al, Ch, Fe, Ni, Zn, Ga, Ag, Pd, Pt, Au, In, Sb, Bi, Te, Mn, P, Co or combinations thereof. The metal additive can, for example, be a particle, a coating or a nanoparticle.

Particle mixture compositions of the invention can also include an organic vehicle which may include, for example, a solvent, a flux and optionally a means to self-inert, a thermoplastic polymer and polymer precursors. When present, the flux will typically include a carboxylic acid, an inorganic acid, an alkanolamine, a phenol, a rosin, or a combination thereof.

The present invention also provides interconnected metallurgical networks formed by heating the metallic particle compositions described herein to a temperature $T_1$, such that the resulting network includes an intermetallic species of the first metal and the second metal; and an alloy of the second metal and the carrier. Such networks are electrically and mechanically stable when subsequently heated to $T_1$.

In certain embodiments, the network includes one or more second metallic particle component selected from: at least one second metal alloy that melts at $T_1$, at least one second metal or alloy thereof that regenerates molten reactive species when the reactive second metal is depleted by reaction with the first reactive metal, and nanoparticles of the second reactive metal. In such embodiments, the reaction products of formed at $T_1$ include at least 75 mass % of a thermally stable component that does not melt below 300° C., and at least 5 mass % of a remelting component that remelts at a temperature $T_2$ that is below 220° C. Remelting of the remelting components occurs with consistent energy throughout multiple exposures up to 300° C. and the remelting component is dispersed throughout the network, without extruding from the network when molten. As such, remelting reduces the bulk elastic modulus of the network. In certain aspects, the reaction products include at least 10 mass % of the remelting component. In other aspects, the reaction products comprise about 25 mass % of the remelting component.

Also provided are methods for making an electrically and thermally conductive interconnection including the steps of applying an amount of a composition according to the invention to an assembly of at least two parts that are to be electrically and thermally interconnected; heating the composition to a temperature $T_1$, between about 135° C. to 220° C., where the first and second metals combine to form at least one intermetallic species. In certain embodiments, substantially all of the first metal is converted to the intermetallic species. Such intermetallic species are thermally stable metallic components of the interconnection that do not melt below 300° C.

In certain methods of the invention, a metallic network is produced that includes at least 75 mass % of the thermally stable component, and at least 5 mass % of a remelting component that remelts at temperature $T_2$, that is below about 220° C., with the result that the remelting component is dispersed throughout the network. In some aspects of the invention, the resulting the metallic network includes at least 10 mass % of the remelting component, while in other aspects, the remelting component is about 25 mass % of the metallic network. Typically, $T_2$ is below 180° C. and frequently below 150° C. Upon heating the network to a temperature between $T_2$ and about 300° C., the remelting component is molten but the thermally stable component is not molten. Such a remelting process reduces the bulk elastic modulus of the network, which is especially useful when interconnecting parts that have different CTEs than the interconnecting composition and/or each other.

DETAILED DESCRIPTION

Figure 1:
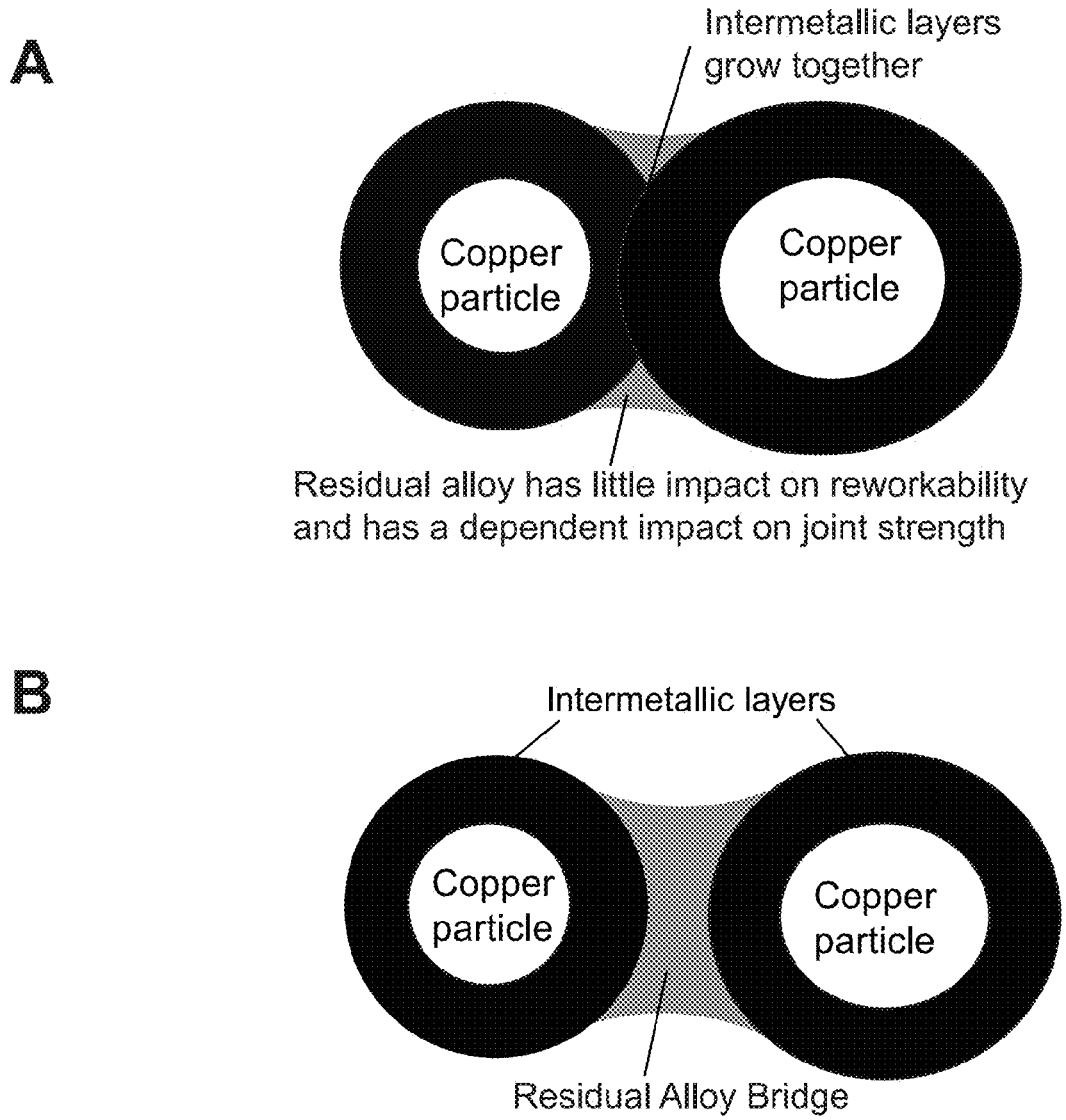
FIG. 1 illustrates the metallic networks formed from conventional metallic particle compositions. Panel A shows a network formed from conventional TLPS composition having an excess copper and a tin-bismuth alloy. Panel B shows a network formed from a similar TLPS composition where in the tin-bismuth alloy is in excess.

It is to be understood that both the foregoing general description and the following detailed description are exemplary and explanatory only and are not restrictive of the invention claimed. As used herein, the use of the singular includes the plural unless specifically stated otherwise.

DEFINITIONS

As used herein, "or" means "and/or" unless stated otherwise. Furthermore, use of the term "including" as well as other forms, such as "includes," and "included," is understood as "comprising" and is not limiting. The section headings used herein are for organizational purposes only and are not to be construed as limiting the subject matter described. It is to be understood that as used in the specification and in the claims, that the singular form of any word can also refer to the plural, depending upon the context in which it is used. For example, "a" or "an" can mean one or more, depending upon the context in which it is used. Thus, reference to "a metal" can mean that at least one metal, two metals, or a plurality of metals.

"About" or "approximately" as used herein means that a number referred to as "about" or "approximately" comprises the recited number plus or minus 1-10% of that recited number. For example, about 50 nucleotides can mean 45-55 nucleotides or as few as 49-51 nucleotides depending on the situation. Whenever it appears herein, a numerical range, such as "45-55", refers to each integer in the given range; e.g., "45-55%" means that the percentage can be 45%, 46%, etc., up to and including 55%. Where a range described herein includes decimal values, such as "1.2% to 10.5%", the range refers to each decimal value of the smallest increment indicated in the given range; e.g. "1.2% to 10.5%" means that the percentage can be 1.2%, 1.3%, 1.4%, 1.5%, etc. up to and including 10.5%; while "1.20% to 10.50%" means that the percentage can be 1.20%, 1.21%, 1.22%, 1.23%, etc. up to and including 10.50%.

As used herein, the term "substantially" refers to a great extent or degree. For example, "substantially all" typically refers to at least about 90%, frequently at least about 95%, often at least 99%, and more often at least about 99.9%.

The term "alloy" refers to a mixture containing two or more metals, and optionally additional non-metals, where the elements of the alloy are fused together or dissolving into each other when molten.

"Flux" as used herein, refers to a substance, often an acid or base, used to promote fusing of metals and in particular, removes and prevents the formation of metal oxides.

The terms "melting temperature" or "melting point," as used herein, refer to the temperature (a point) at which a solid becomes a liquid at atmospheric pressure.

The terms "high melting temperature metal", "high melting point metal" or "HMP metal" as used herein, refers to a metal having a melting temperature that is equal to, or higher than, about 400° C.

The terms "low melting temperature metal", "low melting point metal" or "LMP metal" as used herein, refers to a metal having a melting temperature that is lower than about 400° C.

The term "eutectic" refers to a mixture or an alloy in which the constituent parts are present in such proportions that the melting point is as low as possible, the constituents melting simultaneously. Accordingly, a eutectic alloy or mixture solidifies at a single temperature.

The term "non-eutectic" refers to a mixture or an alloy that does not possess eutectic properties. Accordingly, when a non-eutectic alloy solidifies, its components solidify at different temperatures, exhibiting a melting range.

The term "differential scanning calorimetry" ("DSC") refers to a method of thermal analysis in which the difference in the amount of heat required to increase the temperature of a sample and reference are measured as a function of temperature.

The term "sintering" refers to a process in which adjacent surfaces of metal powder particles are bonded by heating. "Liquid phase sintering" refers to a form of sintering in which the solid powder particles coexist with a liquid phase. Densification and homogenization of the mixture occur as the metals diffuse into one another and form new alloy and/or intermetallic species.

In "transient liquid phase sintering" or "TLPS", the liquid phase exists for a only short period of time as a result of the homogenization of the metals to form a mixture of solid alloy and/or intermetallic species. The liquid phase has a very high solubility in the surrounding solid phase, thus diffusing rapidly into the solid and eventually solidifying. Diffusional homogenization creates the final composition without the need to heat the mixture above its equilibrium melting temperature.

"Modulus" or "Young's modulus" as used herein, is a measure of the stiffness of a material. Within the limits of elasticity, modulus is the ratio of the linear stress to the linear strain which can be determined from the slope of a stress-strain curve created during tensile testing.

The "Coefficient of Thermal Expansion" or "CTE" is a term of art describing a thermodynamic property of a substance. The CTE relates a change in temperature to the change in a material's linear dimensions. As used herein "$\alpha_1$ CTE" or "$\alpha_1$" refers to the CTE before the $T_g$, while "$\alpha_2$ CTE" refers to the CTE after the $T_g$.

The term "processing temperature" or "$T_1$" refers to a temperature at which two reactive metals (e.g. Cu and Sn) form intermetallic species.

The terms "intermetallics" or "intermetallic species" refer to a solid material, which is comprised of two or more metal atoms in a certain proportion, that has a definite structure which differs from those of its constituent metals.

The term "bulk resistivity" refers to the inherent electrical resistance of a material "in bulk," i.e., regardless of the shape or size.

"Adhesive" or "adhesive compound" as used herein, refers to any substance that can adhere or bond two items together. Implicit in the definition of an "adhesive composition" or "adhesive formulation" is the fact that the composition or formulation is a combination or mixture of more than one species, component or compound, which can include adhesive monomers, oligomers, and/or polymers along with other materials, whereas an "adhesive compound" refers to a single species, such as an adhesive polymer or oligomer. More specifically, adhesive composition refers to un-cured mixtures in which the individual components in the mixture retain the chemical and physical characteristics of the original individual components of which the mixture is made. Adhesive compositions are typically malleable and may be liquids, paste, gel or another form that can be applied to an item so that it can be bonded to another item.

The dielectric loss of a material is referred to as the "tan delta" and the inverse of this quantity is referred to as the "Quality Factor", "Q Factor" or "Q."

"Interfacial thermal resistance," also known as "thermal boundary resistance," is a measure of an interface's resistance to thermal flow.

In standard transient liquid phase sintering powder metallurgy, a relatively low melting point (LMP) metal alloy and a relatively high melting point (HMP) metal are mixed in particulate form. At least one element within the LMP alloy is reactive with the HMP metal. As the temperature is raised to the processing temperature, the LMP alloy particle types become molten. This transition can be observed as an endothermic event in differential scanning calorimetry (DSC). The reactive element within the LMP alloys then react with the receptive HMP metal to form intermetallics and the residual LMP alloy constituents form new alloy compositions. The formation of intermetallic species may be observed as an exothermic event by DSC. Thus, the typical TLPS DSC "signature" is an endotherm followed by an exotherm. The diffusion and reaction of the reactive element from the LMP alloy and the receptive HMP metal continues until the reactants are either fully depleted, there is no longer a molten phase at the process temperature, or the reaction is quenched by cooling the mixture. After cooling, subsequent temperature excursions, even beyond the original melt temperatures, do not reproduce the original melt signature of the mixture. This is the "signature" of a typical low temperature post-processing transient liquid phase sintered metal mixture.

As suggested above, however, TLPS is limited by the proportions of the LMP metal and HMP metal, one of which may become exhausted during processing to intermetallic species. In conventional single LMP alloy TLPS compositions, when the LMP metal is in excess, the residual carrying metal (e.g. Bi) with less desirable properties is also in large proportion in the processed mixture. Conversely, when the HMP metal is in excess, once the LMP metal in the alloy has been exhausted, the ability to form additional intermetallics between the HMP metal and the LMP metal has been exhausted.

The present invention is based on the observation that by blending or mixing alloys, the proportion of residual carrying metal (e.g. Bi) with less desirable properties in the final processed TLPS network, can be controlled, while maximizing the amount of desirable intermetallic species formed. Moreover, the properties of the residual alloy present in the final TLPS network can be optimized to yield, e.g., less rigid networks that are at the same time more resistant to thermal and mechanical stress. An unexpected advantage of the controlled formulation is the formation certain metallurigical networks with the ability to absorb CTE mismatch stress when adhered to different materials.

The metallurgical networks formed according to the invention are useful for electrically, thermally and/or mechanically connecting elements within electrical structures. Examples of applications in which inventive compositions are useful are connecting semiconductor die to packaging elements, connecting packaged semiconductor components to printed circuit boards, connecting other discrete components to electronic substrates, forming connections between stacked die, as circuit traces, to fill holes in electronic substrates, to interconnect circuit layers in printed circuit boards and/or semiconductor packages, to form collection grids for solar panels, to form electrically conductive pillars, cylinders or columns, to electrically interconnect electrical subsystems through interposer structures, and the like.

TLPS also includes organo-metallic conductive compositions that include a high melting temperature metal powder, a low melting temperature alloy powder and a permanent adhesive-flux polymer system. Such TLPS compositions are employed, for example, to form conductive paths on printed circuits by creating a patterned deposition of the TLPS composition and then simultaneously sintering and curing the composition at relatively low temperature. During heating, the adhesive-flux polymer system fluxes the metal powders, enabling TLPS to occur. After heating, the adhesive-flux chemically binds the resultant metal oxides, rendering them harmless. For this reason, these compositions provide good electrical conductivity with little opportunity for conductivity deterioration due to oxidation, corrosion or thermal expansion and contraction.

The microstructure of processed conventional TLPS compositions appears as a metallic network of particles of high melting temperature metal bearing one or more "shells" of newly formed alloys and intermetallics, which are interconnected by the non-reactive portion of the original low melting temperature alloy (see FIG. 1). Open areas of the metallic network structure are generally filled by the cured polymeric binder. When the proportion of intermetallic shells is sufficient and/or the residual low melting temperature alloy is limited, the intermetallics can grow together and fuse to form and interconnected network, as shown in FIG. 1, panel A. When the residual low melting temperature alloy is in excess, it can form bridges between adjacent intermetallic/elemental high melting point metal particles, as shown in FIG. 1, panel B.

In contrast to conventional TLPS compositions in which a single high melting temperature metal is reacted with a single low melting temperature alloy in the presence of optional metal additives, the reactive metals in TLPS compositions of the invention can be introduced from a variety of sources to make best use of materials with high commercial availability and to produce an optimized metallurgical network upon completion of the TLPS reaction. In the invention TLPS compositions, a first reactive metal (or metals) and a second reactive metal (or metals) may be present in the composition in substantially elemental form or as alloys, and in some aspects of the invention, may be present as coatings on one or more types of particles. Reaction between the first reactive metal and the second reactive metal may result in either partial or complete consumption of the first metal into a new alloy or intermetallic species that are formed upon heating. The number and type(s) of new alloys and/or intermetallic species formed is dependent on the selection of metallic constituents, their relative proportions, the particle size distribution and the process temperature. The residual components remaining after TPLS reaction (i.e., the second reactive metal and alloys thereof) is also dependent on these factors. To optimize the resulting networks formed from TLPS compositions, the present invention provides for the use of more than one first reactive metal and/or more than one second reactive metal to achieve multiple end products within the processed metallic structure.

The present invention thus provides particle mixtures compositions that include the following components:

A. between about 35 mass % and about 60 mass % of a first metallic particle component comprising at least one first reactive metal, based on the total mass of metal particles in the composition;

B. a second metallic particle component comprising at least one second reactive metal that forms intermetallic species with the first reactive metal at temperature $T_1$, with the intermetallic species have a minimum melting temperature not less than 10° C. above $T_1$, where the second metallic particle component comprises an excess of the at least second metal over the amount required to completely convert all of the at least one first metal to the intermetallic species; and the second metallic particle component includes at least about 10 mass % of an alloy of the at least one second metal and a carrier, where the alloy is molten at $T_1$.

In the practice of the invention, the first reactive metal(s), second reactive metal(s), carrier metals and optionally, metallic additives, are selected so that the products of the transient liquid phase sintering reaction will have the optimum combination of attributes such as thermally stable resistance, ductility, high electrical and thermal conductivity, coefficients of thermal expansion similar to the surrounding materials, and the like, for the intended application.

First Reactive Metal Component

The first reactive metal, which is also referred to herein as the "first metal", is typically a high melting point metal or a combination of high melting point metals. Component A can thus be a single metal or a combination of metals. To achieve a combination, particles of different metals can be blended, for example, to produce the desired combination of metals in specific proportions. In certain embodiments, the first reactive metal is copper, a noble metal, or a combination thereof. In some embodiments, alternative metals may be useful, alone or in combination with copper and/or noble metals, for specific applications (e.g. resistors). Copper is relatively inexpensive, plentiful, compatible with the metallurgy typically used for circuit elements, possesses a melting temperature in excess of 1000° C., is ductile, readily available in a variety of powder forms, and is an excellent electrical and thermal conductor. Silver, gold, platinum, indium and gallium are also specifically contemplated for use in the invention compositions. Such metals may be particularly useful in applications where copper particles would be vulnerable to subsequent manufacturing processes (e.g. copper etching), or in cases where the use of such noble metal would substantially increase the net metal loading by reducing the need for flux. In certain aspects of the invention, the first reactive metal can include aluminum, zinc, nickel, tin, bismuth or antimony alone or in combination with the aforementioned metals.

Second Reactive Metal

The second reactive metal, which is also referred to herein as the "second metal" is typically a low melting point metal or a combination of low melting point metals, and/or alloys thereof. Component B can thus be a single metal, metal alloy or a combination of metals and alloys thereof. To achieve a combination, particles of different metals and metal alloys can be blended, for example, to produce the desired combination of metals and metal alloys in specific proportions.

The second reactive metal may be any one or a combination of elemental or alloy forms of Sn, Bi, Pb, Cd, Zn, Ga, In, Te, Hg, Tl, Sb, Se and Po. Also encompassed by the invention are compositions containing other elemental metals and alloys thereof, where the elemental second metal is reactive with the first reactive metal or metals. A desired combination of second metals can be achieved, for example, by mixing combinations of readily available elemental metals and metal alloys. The combination of second reactive metal(s) and/or alloy(s) containing the second reactive metal results in at least one type of particle that will melt at the selected process temperature $T_1$, thereby making the second reactive metal available for interaction with the other constituents of the TPLS composition. When combined in inventive TLPS compositions, alloys and elemental forms of the second reactive metal combine to form a desired alloy composition in situ.

A principal requirement of the blend of component B particles containing the second reactive metal is that at least a portion of the particles become molten at the process temperature, $T_1$, which renders the full complement of reactive species within the particle blend available for reaction with the first reactive metal prior to vitrification of any polymers in the composition.

Advantageously, not all of the second metal and/or alloys thereof that are present in the TLPS compositions of the invention must have a melting temperature below the intended process temperature, provided that the higher melting metals and/or alloys are soluble in an alloy composition that does melt at the process temperature. Experimentally it has been determined that when at least 10% of the particulate species containing the second reactive metal become molten, all of the second reactive metal is available through regeneration of the molten second metal alloy as the second metal is depleted by reaction with the first reactive metal. Reliability analysis of compositions containing blends of two or more different types of particles containing the second metal has further revealed that where even a small amount of the second metal element is present in excess of the amount required to fully convert all the first reactive metal(s) to intermetallics, the residual second metal remains alloyed with the residual carrier elements. Such compositions exhibit a substantial and unexpected improvement in electrical resistance stability over a variety of thermal excursions. While not wishing to be bound by a particular theory, it is presently believed that this small, permanent alloy phase becomes molten during typical thermal cycling conditions and acts a stress sink to self-heal the network. This characteristic is also of benefit in mitigating the stress caused by differences in coefficient of thermal expansion between the TLPS network and various adherands. Thus, in one aspect, TLPS compositions of the invention have a of ratio metallic constituents that provides a residual second metal-alloy phase after processing at $T_1$ and conversion of all of the first reactive metal to intermetallics.

Lead-Free Compositions

In certain embodiments of the invention the TLPS compositions and the resulting networks processed therefrom are lead-free. The selection of suitable reactive second metals and second metal alloys according to such embodiments is particularly challenging. A first limiting constraint for this challenge is process temperature. The process temperature of TLPS compositions most useful in electronics applications must be low enough that the other materials used in the production of an electronic article or other assembly are not damaged. This temperature is typically about 260° C. or less when the electronic article includes polymeric components. Candidates for the reactive second metal thus include tin, bismuth, lead, gallium, indium, and zinc, yet none of these alone is a perfect choice. Elemental and alloyed lead are excluded due to toxicity. Elemental and alloyed gallium and indium are expensive and not readily available. Elemental and alloyed zinc is incompatible with many common circuit finishes. Alloys that are predominantly composed of tin have melting temperatures in excess of the desired process maximum and will form brittle intermetallics as the exclusive TLPS end products if used with copper or noble metal particles. In addition, such compositions have the potential of forming of tin whiskers.

Alloys of bismuth and tin are suitable and may offer the best overall combination of attributes, although even these attributes may be improved by the addition of other elements. Sn/Bi alloys are readily available at reasonable cost in particulate form. The melting temperature of most common bismuth-tin alloys is within the range of about 135° C. to about 200° C., well under the limit for electronics applications. The tin in the bismuth-tin alloys and the intermetallics formed when tin reacts with copper are all very good electrical and thermal conductors. Furthermore, residual elemental bismuth and copper-tin intermetallics formed by TLPS reaction of Sn/Bi alloys with copper all have melting temperatures outside the typical range of subsequent thermal processing and testing in electronics applications. Tin and bismuth are not considered toxic and are compatible with all typical metal circuit finishes.

Unfortunately, both bismuth and copper-tin intermetallics are brittle and therefore susceptible to damage when exposed to mechanical stress. Further, elemental bismuth is a poor electrical conductor and a very poor thermal conductor. If initially processed below 195° C., a TLPS reaction will self-quench when the composition of the alloy reaches 80 mass % bismuth. Subsequent thermal excursions above 195° C. cause the residual 80 mass % bismuth alloy to melt, upon which the TLPS reaction continues. Such a change may be tolerated during processing, but can be unacceptably unstable in a "finished" article. Resistance changes in articles created with bismuth/tin alloys and copper particles are evident during both high temperature storage and thermal shock. These changes are not observed in articles prepared with lead/tin alloys and copper particles because the melting temperature of the residual tin-lead alloy is well above typical thermal exposures. Moreover, lead is quite ductile and able to absorb thermo-mechanical stress.

The present invention provides compositions and methods that allow the advantageous properties of bismuth/tin alloys in combination with copper or noble metals to be exploited while minimizing the deficiencies. Among the deficiencies are the low electrical and thermal conductivity, and brittleness of bismuth. Therefore, it is desirable to minimize the proportion of bismuth in a TLPS composition. It may also be desirable to combine bismuth with other metals that would render a residual, post-TLPS alloy more ductile and/or conductive. This can be accomplished by creating an alloy composition with a higher proportion of tin or with additional metals not found in the eutectic, and/or other readily available bismuth/tin alloys. It is theoretically possible to create a custom alloy by smelting the desired elements together in the desired proportions. Practically, however, it can be difficult to produce homogeneous metallic particles having specific proportions of more than three elements. In addition, it would be far simpler to use commercially available alloys. Thus, the present invention achieves the goal of customizing the constituent elements present in a TLPS composition by blending various alloys and elemental forms of tin, bismuth and other metals to achieve specific metallurgical compositions.

Although exemplified with alloys of tin and bismuth, the inventive concept of blending various alloy and metal particles to achieve a desired TLPS composition with a particular microstructure is understood to be widely applicable to other metal systems and applications TLPS compositions of the present invention may include specific proportions of a first metal or combination of metals, a second metal or combination of metals, carrier metals and additives such that several stable TLPS products are formed during processing of the compositions. In one embodiment of the invention, TLPS compositions are prepared such that the proportion of the second metal is sufficient to fully convert all of the first metal in the formulations to intermetallic species with an excess of the second metal remaining. In certain aspects of this embodiment, the proportion of residual second metal is such that residual alloy bridges between intermetallic-containing TLPS products remain molten over a broad range, which can be from about 120° C. to about 220° C.

Therefore, in some aspects, the invention further requires a proportion of the second metal in excess of what is sufficient to convert the first metal to the most thermodynamically stable intermetallic. Thus, the excess second metal is alloyed with one or more other elements in the composition, such as a carrier metal, such that there remains a residual molten phase at $T_1$.

The metallic TLPS compositions thus described maybe employed in the creation of thermal or electrical interconnections applied by any available method, such as flame spraying, as a toner, or adhered to a carrier for subsequent transfer. Additives such as nanoparticles, metallic lubricants such as graphite, or organometallic species may be added to achieve the desired characteristics for deposition. Use of the TLPS metal mixture in this fashion is particularly efficacious when the first metal is a noble metal.

In applications requiring coating, screen-printing, stencil-printing, dispensing or the like, the TLPS compositions may further comprise an organic vehicle. The organic vehicle may include a solvent and/or one or more additives to aid in deposition of the TLPS composition. In certain aspects, the organic vehicle includes a flux to clean the surface of metallic particles containing the first metal, particularly when at least one first metal is not a noble metal. Such compositions may also include a means to self-inert the flux when volatilization during processing is not feasible (e.g. in embedded vias). In certain aspects, the invention compositions may include an adhesive, such as a thermoplastic polymer, to adhere the composition to a non-metallic surface. Thermoplastics may also be included where it is desirable to form the TLPS composition of the invention into a predetermined shape prior to processing at $T_1$. In other embodiments, polymer precursors that react to form a polymer network interpenetrating the resulting TLPS metallic network may be included. In keeping with the carefully engineered final microstructure of the metallic network, the organic constituents can be selected in accordance with the requirements of the application to meet specific deposition, processing, adhesion or other performance characteristics.

As described above, compositions that include one or more non-noble metals will generally require the addition of a flux. The flux may be any agent or compound known to those of skill in the art as useful for removing oxides from the surfaces of metal. The flux itself and/or any reaction products thereofay be volatile at $T_1$ or substantially non-volatile at $T_1$. In applications in which invention compositions are employed in an unconstrained format, such as printed circuit traces or EMI shielding coatings, volatile fluxes and/or reaction products may be advantageously employed to increase the net metal loading and thus the electrical conductivity of the processed composition.

Materials contemplated for use as fluxes include carboxylic acids, inorganic acids, alkanolamines, phenols, rosin, and the like. In certain aspects of the invention, the flux is an alkanolamine, carboxylic acid, phenol or mixtures thereof.

Previous attempts to use TLPS compositions in semiconductor die attachment applications have been largely unsuccessful. TLPS compositions heretofore developed included a substantial proportion of solvent that proved very difficult to remove given the small exposed-surface-to-volume ratio of the composition after placement of the die. Pressure was necessary to avoid substantial voiding during processing, which is a sharp departure from the typical die attach processing methods. Attempts to create solvent-free materials in which chemically protected crosslinking agents, resin and monomer components were proportionally increased also resulted in substantial voiding.

Taking inspiration from the blended metal approach described herein, a blended organic vehicle approach has also been investigated. A series of experiments established the lower limits of flux activity necessary to drive the TLPS reaction to completion for a given particle size distribution and proportion of reactive first metal. A second set of experiments established that a wide variety of carboxylic acid bearing, phenolic bearing and tertiary amine bearing compounds could be contemplated for use as a flux. Where it is not possible or practical to eliminate the flux as a volatile component, a monomer or resin may be incorporated in sufficient quantity to neutralize and immobilize the flux components. For example, the flux components may bear functional groups that are latently reactive with monomers or resins. A combination of acidic moieties compounded with tertiary amines to form salts can be used to render the flux latently reactive to monomer or resin, even in the presence of the metals and metal oxides of the TLPS compositions. In these instances, the monomer and/or resin is present in sufficient quantity to react with, neutralize and immobilize the acid and/or amine components in the flux, thus forming a flux-curing subsystem. The proportion of the flux-curing subsystem necessary for specific TLPS composition may be derived directly from the surface area of reactive first metal in the composition that requires fluxing. Once this level has been established for any particular flux-curing system and metallurgy, the remainder of the binder, typically at least half, may be selected from a broad variety of materials that are either co-reactive with the flux-curing subsystem or merely miscible with it.

Using a blended vehicle approach (3 parts carboxylic acid/alkanolamine salt, 2 parts Bisphenol F epoxy resin, 5 parts cycloaliphatic epoxy resin, trace cationic catalyst), substantially void-free bonds have been achieved between 4 mm flat copper squares and an underlying larger copper square. Die shear test results for these parts were better than those typically reported for organic die attach materials, while thermal conductivity measurements are also substantially improved.

Therefore, in applications in which a permanent organic vehicle is advantageous (e.g. substantially enclosed applications, applications requiring adhesion to non-metallic adherands, high thermo-mechanical stress applications), and where a flux is required (e.g. when the first reactive metal includes a non-noble metal) invention compositions are advantageously include a curable flux system including at least one compound selected from those with carboxylic acid and or phenolic functionality; and those with tertiary amine functionality in which each tertiary amine functional group is paired group-for-group with about 50% to about 150% of the combined carboxylic acid and phenol groups. Such curable flux systems also include at least one reactive monomer, polymer or resin in sufficient quantity to chemically immobilize the flux. The curable flux system optionally includes a diluent, such as a solvent; a resin system that is miscible and co-reactive with the curable flux system, which may include a mixture of one or more resins and appropriate curing agents and/or catalysts; monomer(s); resin system(s); or another polymeric component(s) that is miscible or can be distributed throughout the curable flux system, but is not co-reactive with it.

The carboxylic acid and phenol bearing moieties in flux systems according to the present invention serve primarily to flux the reactive first metal. Molecules appropriate for use may be monomeric, oligomeric or polymeric in nature. In certain embodiments, the flux may have has more than one functional group to promote efficient tie-in with the overall organic matrix and in particular the reactive monomer, polymer or resin. Molecular species contemplated for use as flux may include functional groups other than the carboxylic acid and/or phenolic functionalities. Multiple molecular species may be blended together to create an optimum balance of flux activity and other characteristics, such as viscosity, miscibility with other system components, lubricity, reactivity with other organic components and the like. Both the acid strength and equivalent weight for each carboxylic acid and/or phenolic function will determine the quantity necessary for a given surface area of the first reactive metal. Presently preferred is a blend of monomeric and oligomeric species bearing both carboxylic and phenolic functionalities as well as additional functional groups.

The tertiary amines serve as a flux for the reactive first metal and any metallic adherands. They may be employed in a salt form with the aforementioned carboxylyic acid functionalities to prevent premature reaction with other organic components due to the catalytic effect of the metals and metal oxides. Such tertiary amine salts thus form chemically protected species until the composition is thermally processed. The tertiary amine species may be monomeric, oligomeric or polymeric, and a combination of one or more molecules may be used to obtain optimum effect. The tertiary amine functionality may also be present on single molecules, such as when an anhydride is reacted with triethanolamine to form a mono-ester-acid. Due to its efficacy as a flux and its convenient liquid form, triethanolamine is currently a preferred tertiary amine.

The monomer, polymer or resin species may be any species that can react with and effectively immobilize the carboxylic acid and phenol bearing moieties. Species that meet this requirement include, but are not limited to, epoxies, phenolics, novalacs (both phenolic and cresolic), polyurethanes, polyimides, bismaleimides, maleimides, cyanate esters, polyvinyl alcohols, polyesters and polyureas. Other species may be modified to be reactive with the carboxylic acid or phenol bearing moieties. Examples of such species are acrylics, rubbers (butyl, nitrile, etc), polyamides, polyacrylates, polyethers, polysulfones, polyethylenes, polypropylenes, polysiloxanes, polyvinyl acetates/polyvinyl esters, polyolefins, cyanoacrylates and polystyrenes. Typically, any monomer, polymer or resin species would function in this invention if the species can be modified to contain at least one of the following functional groups: anhydrides, carboxylic acids, amides, imides, amines, alcohols/phenols, aldehydes/ketones, nitro compounds, nitriles, carbamates, isocyanates, amino acids/peptides, thiols, sulfonamides, semicarbazones, oximes, hydrazones, cyanohydrins, ureas, phosphoric esters/acids, thiophosphoric esters/acids, phosphonic esters/acids, phosphites, phosphonamides, sulfonic esters/acids or other functional groups known to those skilled in the art to act as reactive sites for polymerization. For example, a polyolefin would not be suitable as a resin in this invention, as it has no reactive sites for binding and has poor adhesive properties; however, an epoxy terminated polyolefin functions well when matched with acidic groups of the flux-curing agents. A multifunctional epoxy resin is a preferred.

Binders serve to tailor the organic vehicle to meet the specific requirements of the application with respect to method of deposition, method of processing, adhesion, bulk mechanical characteristics of the bulk composition after processing, and the like. For instance, in applications in which the TLPS composition will be cast into a film, a large proportion of solvent may be desirable. In contrast, in applications in which the TLPS composition will be dispensed and immediately sandwiched between the two adherands, inclusion of a solvent is undesirable. In applications in which the adherands to be joined will both be metallized with solder-wettable surfaces, the adhesive characteristics of the binder system will be negligible. In contrast, in applications in which one of the adherands is not metallized, the adhesive characteristics of the binder will be quite significant. Similar compositions can be prepared for stress mitigation, viscosity, pot-life, and the like.

Solvents contemplated for use in curable flux system of the invention include any solvent not subject to substantial regulation as health or environmental hazards, which are appropriate to the method of deposition and processing, and which are compatible with the other organic constituents in the invention compositions.

Co-reactive resin systems contemplated for use in the present invention include all those contemplated for use in as part of the curable flux system provided that a latent curing agent or catalyst is also provided in sufficient quantity to cure the resin. In this instance, the term resin encompasses reactive compounds in monomeric, oligomeric or polymeric molecular form. Presently preferred is a thermally activated metallic catalyst and a cycloaliphatic epoxy resin.

Non-co-reactive resin systems contemplated include thermoplastic resins and thermosetting resin systems that cure by chemical mechanisms that are largely incompatible with those of the acid bearing moieties and resin systems of the curable flux system. Typically, inclusion of such non-co-reactive species is contemplated to substantially alter the mechanical characteristics of the processed organic system and may be added in liquid, solution, suspension, or particulate form.

The compositions described may be applied be needle dispensing, stenciling, screen printing, ink jetting, extrusion, casting, spraying or other methods that would be known to those of skill in the art. Once applied, the invention compositions are thermally processed in an oven, on a hot plate, in a lamination press, or by other means typically employed for the processing of solder or filled organic adhesives. The specific thermal process conditions are dependent upon the application as well as selection of the TLPS system and any organic binder constituents.

The present invention embraces the use of the compositions as electrically, thermally and/or mechanically connecting elements within electrical structures. Examples of applications in which inventive compositions are useful are connecting semiconductor die to packaging elements, connecting packaged semiconductor components to printed circuit boards, connecting other discrete components to electronic substrates, forming connections between stacked die, as circuit traces, to fill holes in electronic substrates, to interconnect circuit layers in printed circuit boards and/or semiconductor packages, to form collection grids for solar panels, to form electrically conductive pillars, cylinders or columns, to electrically interconnect electrical subsystems through interposer structures, and the like.

The invention leverages the advantages of hybrid solder-adhesive technology of the TLPS compositions and provides a means to overcome the disadvantages of rigid metal matrices. Invention compositions deliberately create a minor reaction product that is well dispersed throughout the metallic network and melts repeatedly and consistently over multiple thermal exposures. Because this minor reaction product remains well dispersed in the non-melting phase after reaction, it has a dramatic effect on the modulus of the entire network. The dramatic reduction in modulus mitigates of differences in coefficient of thermal expansion of the adherands in a variety of electronic adhesive applications.

Thus, the invention provides TLPS compositions that include a plurality of different types of metallic particles that when thermally processed irreversibly form an interconnected metallic network. The interconnected metallic network includes a minor proportion of a low melting metallic constituent that melts and resolidifies during subsequent thermal excursions. A key feature of this embodiment of the invention is the ability of the minor constituent to cause a significant, reversible drop in the modulus of the interconnected metallic network, thereby permitting the network to absorb coefficient of thermal expansion mismatch stress when adhered to different materials without causing permanent damage to either the adherends or the interconnected metallic network.

As discussed above, deliberate incorporation of an excess of the second (low melting temperature) reactive metal through formulation of the second metallic particle component, prevents degradation of the electrical conductivity of the cured composition throughout subsequent thermal cycling and high temperature storage. However, it was not anticipated that such a small residual melt phase would have such a dramatic effect on the modulus of the entire metallic network.

In certain embodiments, the invention further provides TLPS compositions of metallic particle that react temperatures between about 80° C. and 220° C. to form a metallic network with the following surprisingly advantageous properties:
1. the network includes multiple reaction products metallurgically alloyed to form a continuous network structure;
2. at least about 75% of the metallic network structure does not melt below 300° C.;
3. the residual portion of the metallic network that does melt below 300° C. does not change appreciably in composition over multiple thermal excursions up to 300° C. and remains disposed throughout the network through multiple thermal excursions and exhibits a broad temperature range over which it is molten;
4. a given volume of the network exhibits a constant enthalpy of melting over multiple thermal excursions; and
5. the bulk modulus of the entire metallic network drops significantly at the onset of melting of said residual melting portion of the network.

Metal species selected for use in the invention compositions are constrained by three requirements. First, they must include a transient reactive species that reacts irreversibly with other metallic constituents in the composition at a process temperature $T_1$ below 220° C. to create new species with melting temperatures in excess of 300° C. Such transient reactive species may be:
1. one or more elemental or alloy metal constituents containing the second metal that melt at the selected process temperature; or
2. one or more elemental or alloy metal constituents containing the second metal that behave symbiotically to regenerate said molten reactive species as described in (1) as the reactive element(s) are depleted; or
3. one or more species of metallic nanoparticles of the second metal.

Examples of metal constituents that melt at a process temperature below 220° C. include tin-bismuth alloys that have an onset of melting at 138° C. The tin in such an alloy reacts irreversibly with, e.g. copper to form copper-tin intermetallics, thereby leaving a residual bismuth-rich alloy behind. Exemplary second metal constituents that behave symbiotically to regenerate molten reactive species include combinations of a tin-bismuth alloy and a tin-rich alloy, when used in conjunction with copper particles at a process temperature $T_1$ intermediate between the melt points of the two alloys. In this case, the tin-bismuth alloy becomes molten and the high-tin alloy becomes soluble in the molten alloy, thereby making all of the tin available for reaction with the copper. Nanoparticle versions of a metal that does not typically react at the selected process temperature could also be employed. In this circumstance, the low fusion temperature characteristics of nanomaterials can be exploited, which thereby make such nanomaterials suitable for use as a transient reactive species.

A second requirement for the metal species according to this embodiment of the invention is that the reaction products (i.e. intermetallics and residual alloys) must be apportioned such that at least 75% do not melt below 300° C., but at least 5 mass % do remelt at a temperature $T_2$ that is below 220° C., and such remelting occurs with consistent energy throughout multiple exposures up to 300° C. The residual molten phase must be present in sufficient quantity to ensure that it is well dispersed throughout the network, but in a sufficiently limited quantity that it does not coalesce and extrude from the network when molten. This quantity of residual molten phase has been experimentally determined to be between 5 mass % and 25 mass %. Thus, in some aspects of the invention, the residual molten phase comprises about 5, about 6, about 7, about 8, about 9, about 10, about 11, about 12, about 13, about 14, about 15, about 16, about 17, about 18, about 19, about 20, about 21, about 22, about 23, about 24 or about 25 mass percent of the processed network. The residual molten phase generally has an onset of melting lower than about 180° C., and typically less than about 150° C. These temperatures represent the points at which organic laminate materials used in electronic applications undergo the glass transition shift with its attendant large change in coefficient of thermal expansion.

The proportions of the metallic constituents necessary to achieve the desired reaction products will vary by the constituents chosen, the particle sizes and shapes (the formation of some intermetallic species, for instance, is self limiting in thickness), and the process conditions.

Finally, the third requirement for the metal species according to this embodiment of the invention is that the remelting reaction product from the selected metallic constituents must significantly and consistently reduce the bulk elastic modulus of the composition at the onset of melting over multiple thermal excursions.

Metal particles contemplated for use encompass spheres, rods, flakes, discs, ribbons and suspensions. The size of metal particles ranges from nanoparticles to particles that are on the order of tens of microns in size.

While it is believed that the invention compositions offer particular utility for electronic adhesive applications, particularly for IC die, alternative applications in which two electronic elements are to be joined, as well as applications such as microvia-fill and printed circuit traces are also contemplated.

According to this embodiment, the invention provides TLPS compositions that are a hybrid of solder and conductive adhesive joining technologies. Electrical connections are established through a plurality of metallurgical connections formed in situ from powders of a reactive first metal and powders of a reactive second metal and alloys thereof. Optionally, the compositions of the invention include an organic vehicle as described above. Thus, the TLPS compositions of the instant invention provide tailored metallurgical networks that inherently self-heal and can relieve stress caused by thermal expansion mismatch.

The methods described for use of such compositions in the manner claimed are well known to those skilled in the art. Alternative methods not disclosed, but which would be readily contemplated by those of skill in the art, are also embraced by the invention.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

The invention may be better understood by reference to the following, non-limiting examples.

EXAMPLES

Example 1

Figure 2:
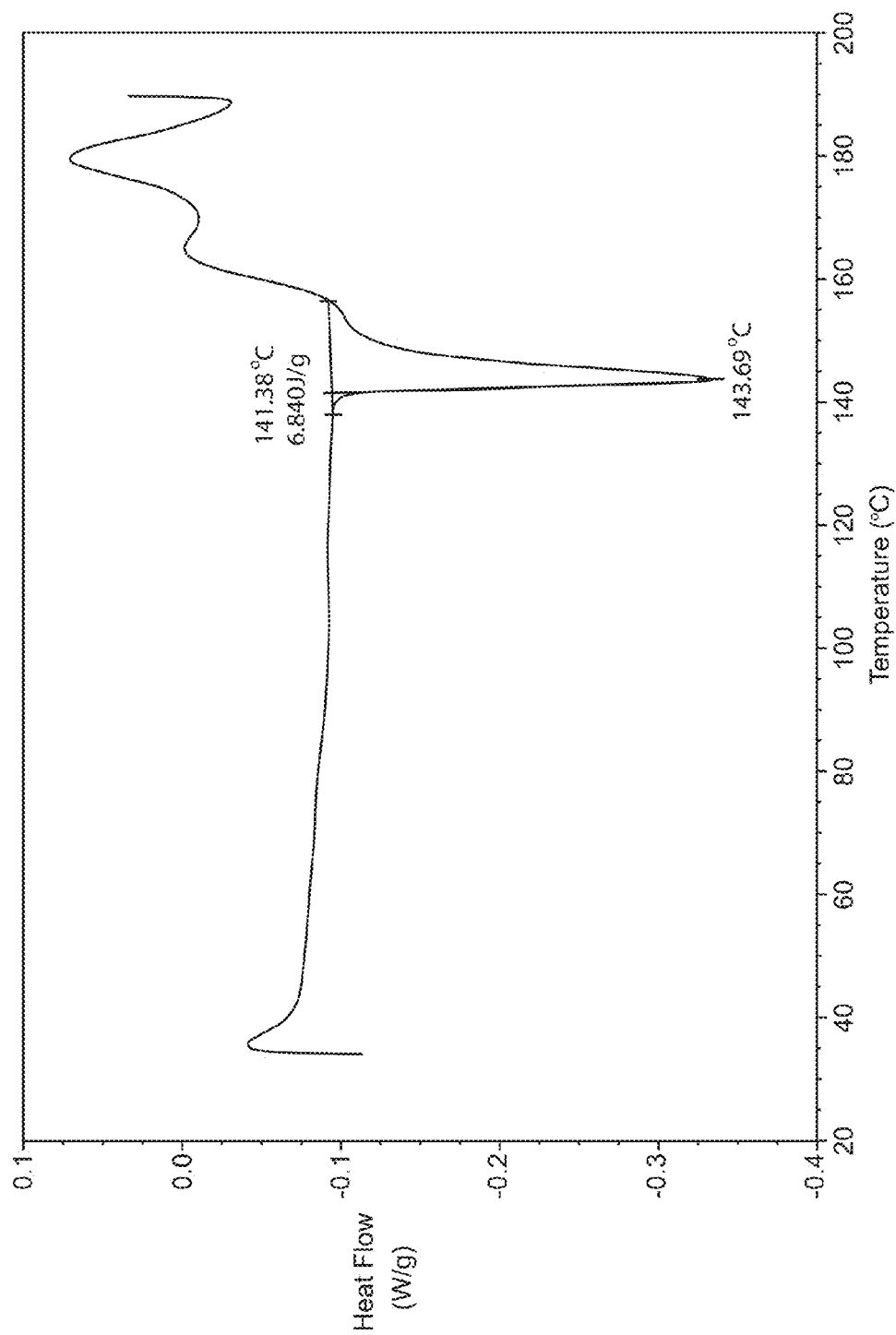
FIG. 2 shows a DSC curve of TLPS composition containing 46 mass % Sn (from a single alloy source) and 40 mass % Cu in a fluxing epoxy mixture.
Figure 3:
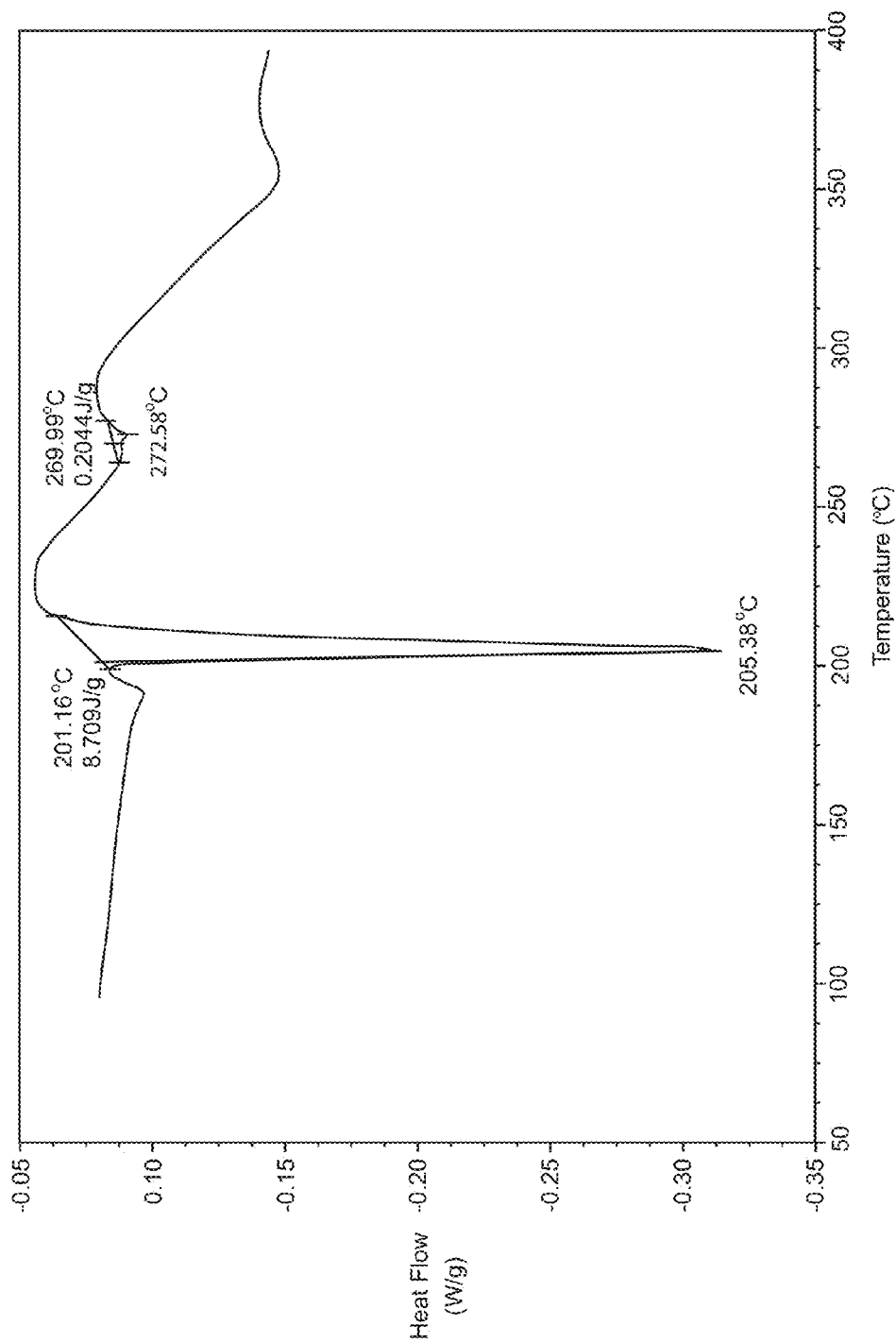
FIG. 3 shows DSC analysis of the processed TLPS composition of FIG. 2.
Figure 4:
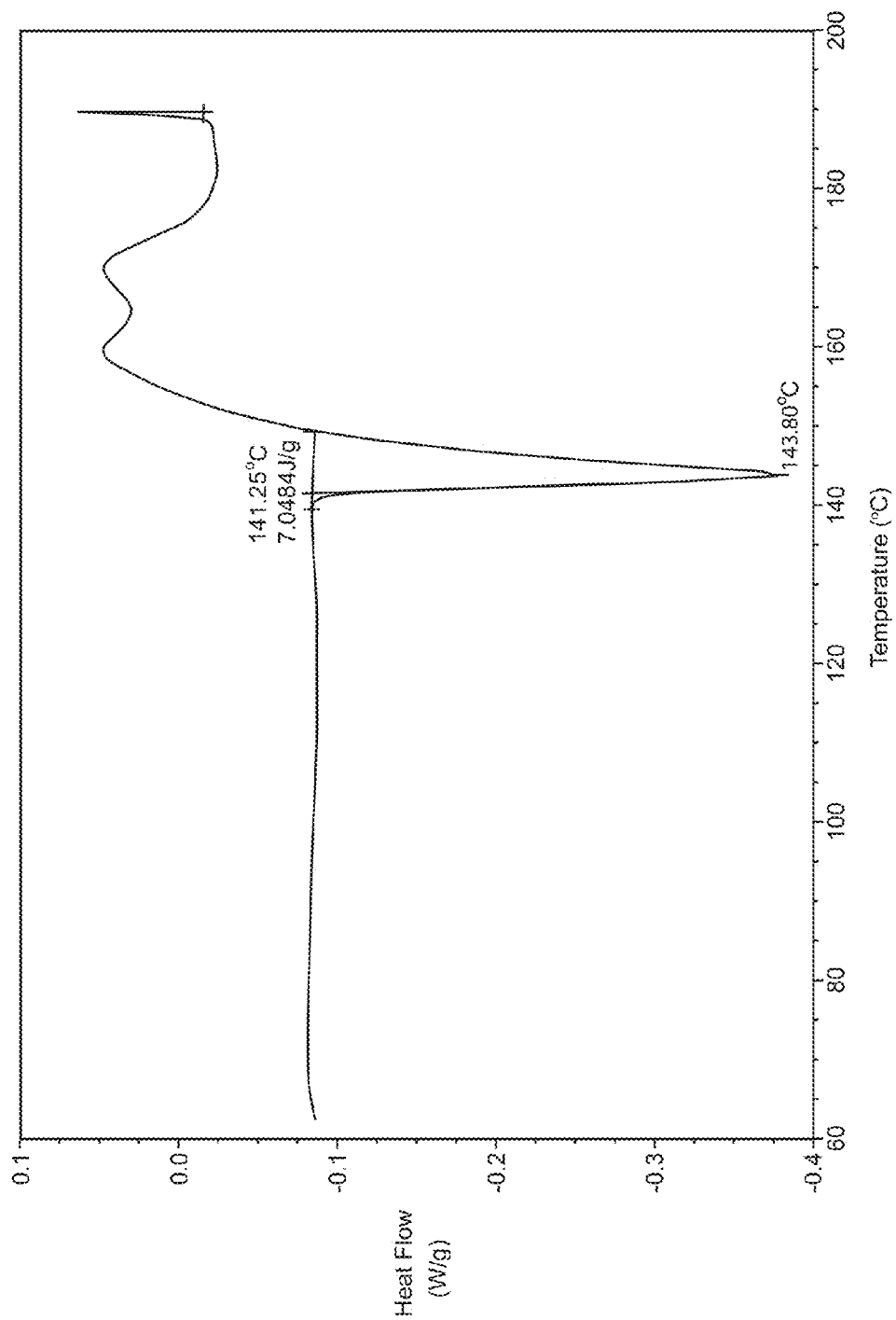
FIG. 4 shows a DSC curve of 190° C. processing of the blended-alloy elemental equivalent of the composition of FIG. 2.
Figure 5:
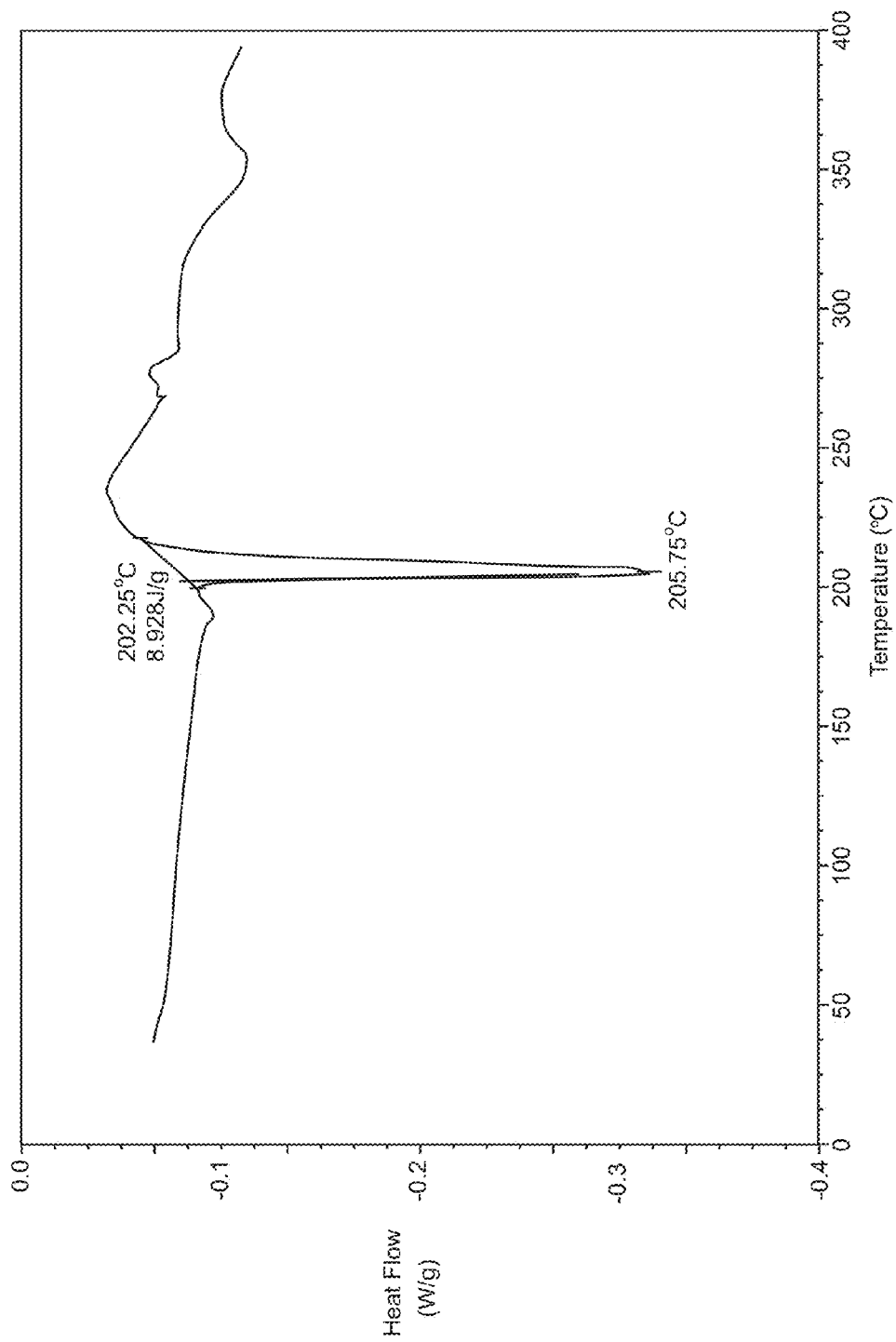
FIG. 5 shows DSC analysis of the processed TLPS composition of FIG. 4.

A non-standard tin-bismuth alloy having 60 mass % tin and 40 mass % bismuth was combined with elemental copper particles, and a fluxing organic binder. The fluxing organic binder used in all Examples was a mixture containing methyl tetrahydrophthalic anhydride monoglycerin ester (1.35 g); triethanolamine (1.00 g); Bisphenol A in a 50% weight solution with butyl carbitol (2.96 g); Araldite MY721 epoxy resisn (0.74 g) and Butyl carbitol (0.2 g). FIG. 2 depicts the TLPS reaction as the composition was heated from room temperature to 190° C., and then held at the final temperature for ten minutes. The first downward peak reflects endothermic melting of the non-standard alloy and the following upward peak is the exothermic formation of copper-tin intermetallics. The DSC scan shown in FIG. 3 depicts a subsequent thermal excursion of the sample processed in FIG. 2. The DSC signature observed for the subsequent thermal excursion was substantially different from the first because new reaction products had been formed, replacing the initial metals and alloys. A second TLPS composition was prepared with the same elemental composition as the first; however, the equivalent proportions of tin and bismuth were achieved by blending the same eutectic tin-bismuth powder with a powder containing predominantly tin that melts at 217° C. The sample was processed identically to the first. The initial process scan (FIG. 4) was similar to that observed for the first sample as shown in FIG. 2. During the second thermal excursion (FIG. 5), the signature observed was similar to that observed with the first sample (FIG. 3). However, there is little evidence of the original predominantly tin alloy in the DSC scan, even though the process temperature of 190° C. was well below the melting temperature of the alloy tin alloy. This phenomenon has been observed with a number of TLPS compositions in which the proportion of non-molten to molten alloy phase was as high as 3:1. The ability to decrease the tin-bismuth alloy allows a substantial decrease in the proportion of undesirable bismuth in the composition.

Example 2

Figure 6:
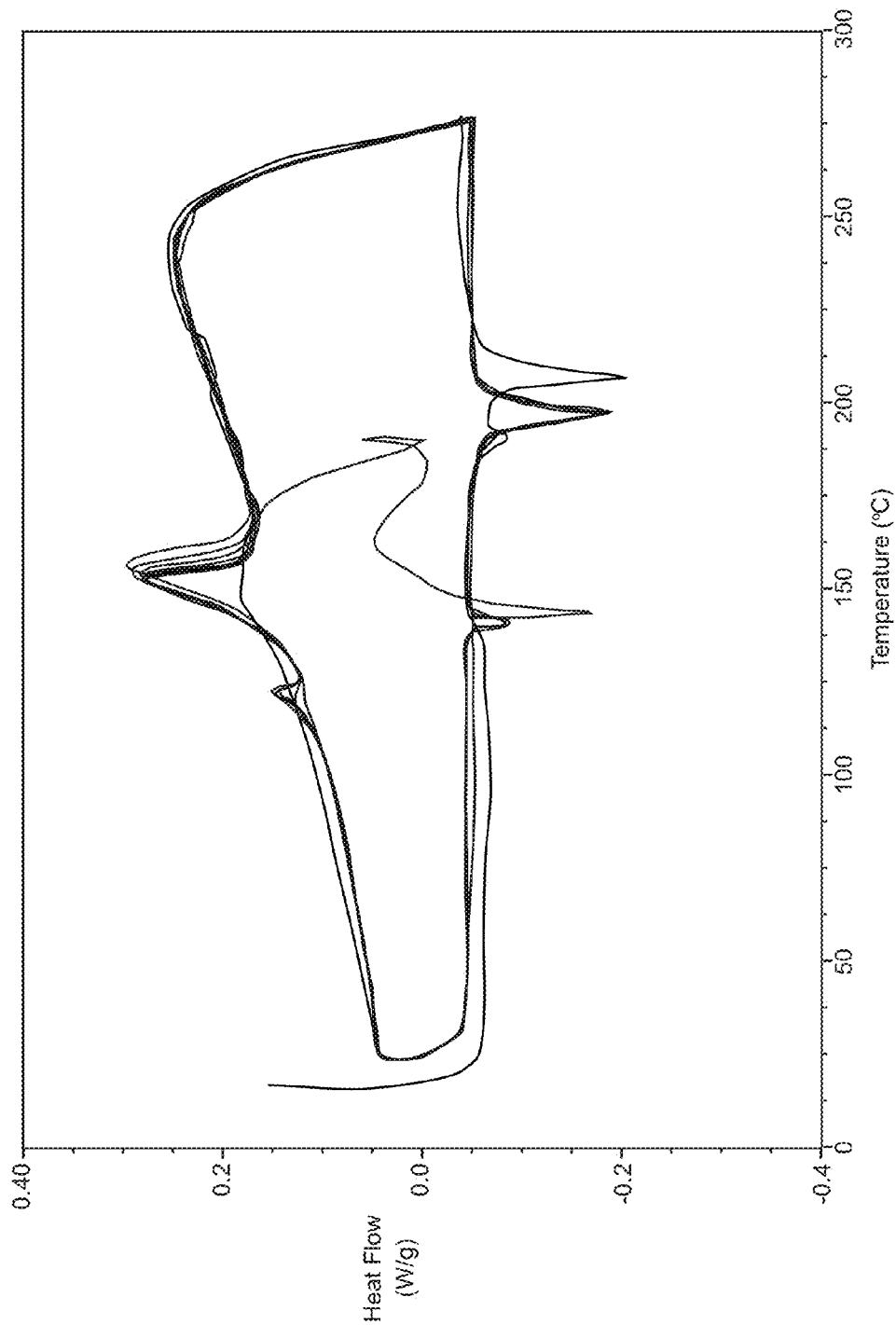
FIG. 6 shows a DSC curve illustrating the stability of residual Bi:Sn alloys.
Figure 7:
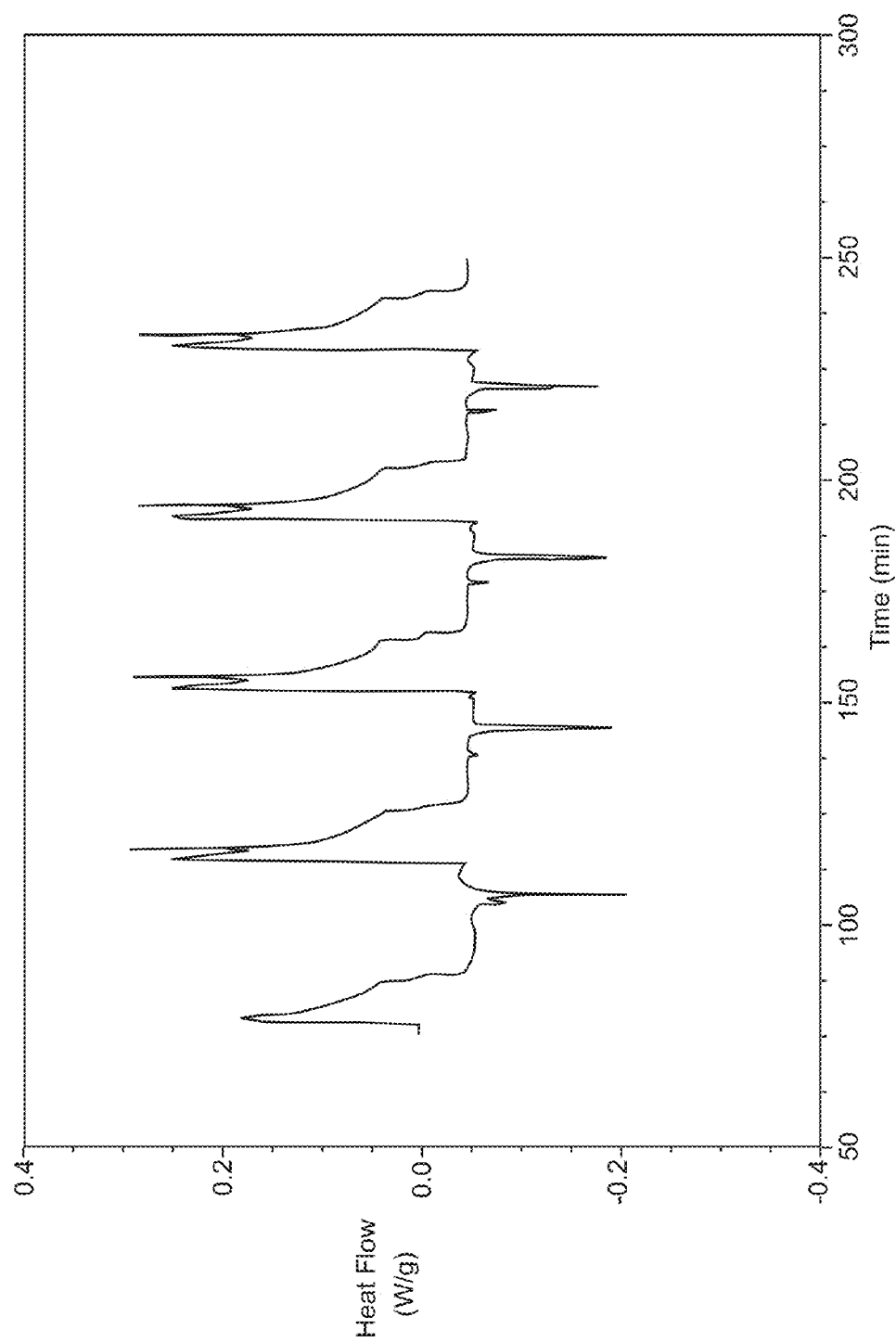
FIG. 7 shows a DSC curve illustrating the stability of residual Bi:Sn alloys as a function of sequential thermal cycles.
Figure 8:
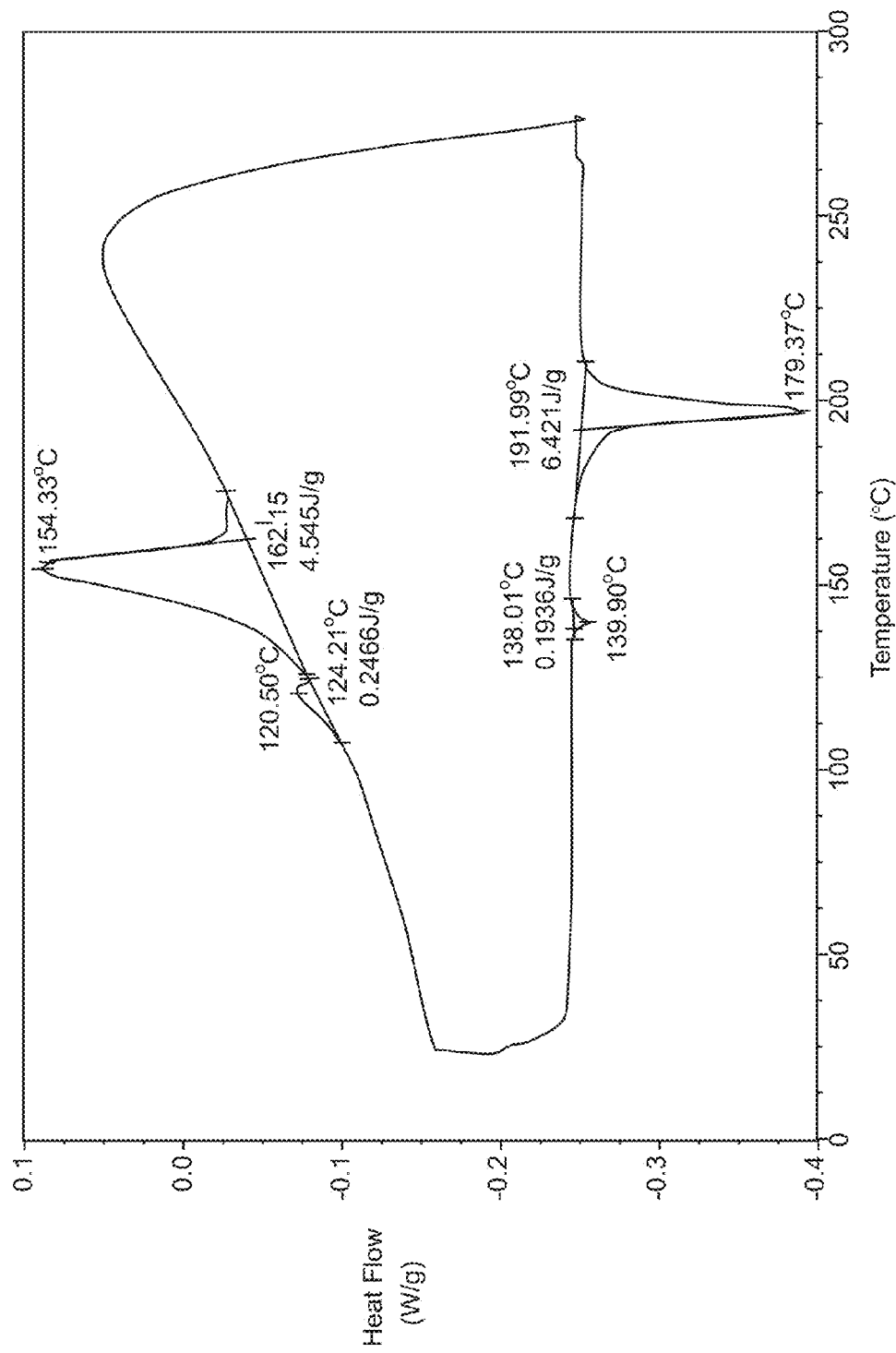
FIG. 8 illustrates the bridging range between eutectic Bi:Sn (58:42) and Bi:Sn (80:20).

TLPS compositions containing 36 parts copper, 25 parts eutectic 58:42 BiSn alloy, and 26 parts SAC 305 alloy (96.5:3.0:0.5 SnAgCu) described in EXAMPLE 2 above, were tested in various constructions (recessed serpentine patterns, conductivity strips cast on glass slides, buried microvias in multilayer printed circuit boards) and thermal excursions from 25° C. to 280° C. FIG. 6 illustrates the stability of the residual alloys over multiple thermal excursions. FIG. 7 also illustrates the stability of the residual alloys as plotted in repeated cycles from 25° C. to 280° C. FIG. 8 demonstrates the bridging nature of the residual alloy compositions encompassed by eutectic Bi:Sn (58:42) and Bi:Sn (80:20), with melt temperatures over a broad range.

Example 3

Ten samples were prepared to investigate the potential of invention technology to be used as a replacement for solder paste in assembling components to circuit boards. All of the samples were designed to have a proportion of tin, in the form of tin alloy, in excess of what was required to convert the copper and silver to copper-tin and silver-tin intermetallics. Copper powder in two different particle size distributions, silver powder, a predominantly tin powder and a tin-bismuth alloy powder were blended with the fluxing epoxy vehicle described in EXAMPLE 1, to yield the elemental proportions summarized in Table 2 below.

Because there were variations in the particle size distributions between the formulations, DSC was used to determine the quantity of residual alloy after processing. Peaks that corresponded with tin-bismuth and high tin alloys were integrated. The results of these analyses are in the table below.

All of the formulations were coated onto copper substrates and 4 mm×4 mm copper squares were placed on top of the coatings. The samples were loaded into a lamination press and cured at 220° C. for 10 minutes at <50 psi. The copper squares were then sheared off of the coating, and the shear values were recorded and compared to benchmark formulations that did not have an excess of tin (26% tin, 54% copper). The benchmark formulation had a shear strength of 1200 psi, while the experimental samples containing excess tin had higher shear strength. Solders are typically 7,500-10,000 psi.

TABLE 2

| Constituent | Low range (mass %) | High range (mass %) |
|---|---|---|
| Copper | 33 | 49 |
| Silver | 1 | 8 |
| Tin | 39 | 52 |
| Bismuth | 7 | 13 |
| Fluxing epoxy mixture | 10 | 10 |
| Alloy Remelt after Processing | 3.47 J/g | 7.7 J/g |
| Die Shear Strength (PSI) | 5322 | 8870 |

The best results were obtained with formulations in the middle of the remelt range.

Example 4

The sample pellets created during the differential scanning calorimetry analyses of EXAMPLE 3 were subjected to multiple thermal excursions to 300° C. For all of the materials analyzed, the remelt energy remained consistent over 10 remelting cycles. When the samples were removed from the instrument, they were microscopically examined for evidence of extrusion of the residual alloy. No residual alloy was observed on the dark gray surface of any of the pellets. These results indicated that the residual alloy phase remained dispersed within the processed metallic network throughout thermal cycling in excess of the melting point of the residual alloy and its elemental constituents, and did not extrude from the network.

Example 5

An experiment was performed to determine if circuits formed from invention compositions could withstand industry standard tests for printed circuit boards when encased within a substrate with a substantially different coefficient of thermal expansion (CTE) from the invention formulation. The industry standard for the test performed is that the resistance of the circuit not change by more than 10%. Two formulations were prepared from 10 mass percent of a fluxing epoxy binder (see EXAMPLE 1), copper particles, and tin-based alloys. The formulations were installed into recessed serpentine patterns in epoxy dielectric on FR4 substrates. The serpentine patterns varied in line width from 8-20 mil and the lines were several inches long.

The formulations were cured in a lamination press at 190° C. for one hour. The resistance of the serpentine patterns in the cards thus fabricated were measured and recorded. The test cards were then subjected to repeated immersion in oil heated to 260° C. The glass transition temperature of the epoxy dielectric and FR4 board is approximately 180° C. Below the glass transition, the epoxy dielectric has a CTE of about 30 ppm/° C. and the FR4 has a CTE of approximately 17 ppm/° C. Above the glass transition, the CTE of the epoxy dielectric increases dramatically to well over 100 and the resin within the FR4 also increases in CTE although it is constrained by the glass reinforcement fabric. The CTE of invention compositions remains at about 22 ppm/° C. over the entire temperature range of the experiment. After six immersion cycles, the resistance of the serpentine patterns was again measured and recorded. The composition of the formulations and the resistance results are provided in Table 3 below.

TABLE 3

| Sample No. | Formulation (mass %) | | | Remelt Energy of Residual Alloys after DSC processing (J/g) | Change in resistance after 6 hot oil dips |
|---|---|---|---|---|---|
| | Sn | Cu | Carrier metal | | |
| 1 | 30 | 42 | 19.3 (Pb) | 1.1 | 45% |
| 2 | 46 | 40.5 | 11.4 (Bi) | 8.2 | 10% |

The formulation with the excess tin and therefore residual tin alloy was able to remain within the specification.

Example 6

The formulations of EXAMPLE 5 and two additional formulations were subjected to thermomechanical analysis to determine the elastic modulus of the processed materials as a function of temperature. The results of this analysis and salient features of the formulations are summarized in Table 4 below.

TABLE 4

| | Formulation | | | Remelt energy (DSC) J/g | | | Elastic modulus GPa at 25° C. | Elastic modulus GPa at 300° C. | Onset temperature of sharp change ° C. |
|---|---|---|---|---|---|---|---|---|---|
| | | | | Bi:Sn 58:42 or 63:37 Sn:Pb | Bi:Sn 80:20 | SAC 305 | | | |
| No. | Sn | Cu | Carrier metal | | | | | | |
| 1 | 30 | 42 | 19.3 (Pb) | 0.90 | — | — | 20.5 | 1.3 | 250 |
| 2 | 46 | 40.5 | 11.4 (Bi) | 0.2 | 6.4 | — | 23.2 | 1.7 | 140 |
| 3 | 20 | 75 | 4.9 (Bi) | 0.2 | — | — | 20.6 | 7.8 | 250 |
| 4 | 15.3 | 62 | 10.2 (Bi) | 0.1 | — | — | 22.9 | 9.7 | 250 |

Only Formulation 2 had a substantial change in modulus at about the glass transition temperature of the polymer materials typically used in the manufacture of printed circuit boards. The substantial decrease in modulus at this temperature may explain why the formulations with significant remelt energy maintain stable resistance through thermal cycling when installed in printed circuit board constructions.

Example 7

Four formulations were prepared for installation into buried via holes in a multilayer printed circuit board construction. Each test board contained 1776, 5 mil diameter vias connected in series by copper circuits within the board. An adhesive dielectric was tacked to one surface of each circuit layer, the vias were laser ablated through the adhesive dielectric to the underlying copper pads, the via holes were filled with the formulations (one formulation per test part) and the solvent was dried out. The circuit layers with the adhesive dielectric were then interleaved and thermally processed in a lamination press at 190° C. for one hour. The resistance of each "daisy chain" circuit with the several thousand vias was measured and recorded. The test parts were then subjected to 6 solder reflow cycles with a peak temperature of 250° C. The results of this experiment and salient formulation characteristics are summarized in Table 5 below.

TABLE 5

| Formulation | | | Remelt Energy of Residual Tin Alloys (DSC) J/g | | | Initial | Final | |
|---|---|---|---|---|---|---|---|---|
| | | | Bi:Sn | Bi:Sn | SAC | Resistance | Resistance | Change in |
| No. | Sn | Cu | Bi | 58:42 | 80:20 | 305 | (Ohm) | (Ohm) | Resistance |
| 5 | 47 | 41 | 12 | 0.22 | 7.24 | 0 | .96 | 1.02 | 6% |
| 6 | 43 | 38 | 17 | 0.84 | 9.08 | 0 | .99 | 1.48 | 49% |
| 7 | 55 | 31 | 14 | 4.77 | 1.44 | 0 | .98 | 1.38 | 41% |
| 8 | 27 | 55 | 18 | 0 | 0.2 | 0 | .96 | 1.85 | 93% |

This example demonstrates that there is an optimum range of residual tin alloy for this application.

Example 8

A formulation was prepared for attaching a metallized semiconductor die to a silver-plated lead frame. The formulation contained 35 mass % Sn (from two alloy sources), 49 mass % Cu, 14 mass % Bi and the balance a fluxing epoxy mixture. When processed, the residual tin-alloy remelt was calculated to be 0.08/5.99/3.07 (58:42/80:20/SAC305) J/g (DSC). The formulation was deposited as a 35 micron coating on the lead frame using a temporary stencil. The metallized die was placed on top and the material was processed by ramping from 25° C. to 205° C. over 30 minutes, followed by an isothermal hold at 205° C. for 90 minutes. A shearing tool was used to displace the die on a portion of the samples prepared. The force required to remove the die was recorded for each sample.

A portion of the samples were subjected to three solder reflow cycles with a peak temperature of 260° C. subsequent to 24 hours conditioning in a chamber held at 85° C./85% relative humidity. The shearing tool was used to remove the die from these samples as well and the force required to remove the die was measured and recorded. Samples that were not subject to the conditioning required 40 kg force on average to remove the die. Conditioned samples required 44 kg force on average to remove the die. At 260° C. both types of samples demonstrated approximately 13 kg force required to remove the die. This compares very favorably with state-of-the-art conductive adhesive values of 8 kg force at 260° C.

What is claimed is:

1. A particle mixture composition comprising:
   a) between about 35 mass % and about 60 mass % of a first metallic particle component comprising a first metal, based on the total mass of metal particles in the composition;
   b) a second metallic particle component comprising a second metal that forms intermetallic species with the first metal at temperature $T_1$, wherein the intermetallic species have a minimum melting temperature not less than 10° C. above $T_1$,
   wherein:
      i) the second metallic particle component comprises an excess of the second metal over the amount required to completely convert all of the first metal to the intermetallic species, and
      ii) the second metallic particle component comprises at least about 10 mass % of a first alloy of the second metal and a carrier, that is molten at $T_1$
   wherein heating the particle mixture to T1 produces reaction products comprising:
      (1) at least 75 mass % of a thermally stable component that does not melt below 300° C.; and
      (2) at least 5 mass % of a remelting component dispersed throughout the thermally stable component, that remelts at a temperature $T_2$, wherein remelting $T_2$ is below 220° C., wherein remelting occurs with consistent energy throughout multiple exposures to a temperature between $T_2$ and 300° C.

2. The particle mixture composition of claim 1, wherein the first metal is selected from the group consisting of Cu, Ag, Au, Pt, Ir, Os, Pd, Pt, Ph, Ru, Ga, In, Al, Re, Zn, Ni, Sn, Bi, Sb and combinations thereof.

3. The particle mixture composition of claim 1, wherein the first metal is selected from the group consisting of Cu, Ag, Au, Pt, In, Ga and combinations thereof.

4. The particle mixture composition of claim 1, wherein the first metal is selected from the group consisting of copper, noble metals, and combinations thereof.

5. The particle mixture composition of claim 1, wherein the second metal is selected from the group consisting of Sn, Bi, Pb, Cd, Zn, Ga, In, Te, Hg, Tl, Sb, Se, Po and combinations thereof.

6. The particle mixture composition of claim 1, wherein the second metal is selected from the group consisting of Sn, Bi, Pb Ga, In, Zn and combinations thereof.

7. The particle mixture composition of claim 1, wherein the particle mixture is free of lead.

8. The particle mixture composition of claim 1, wherein $T_1$ does not exceed 260° C.

9. The particle mixture composition of claim 1, wherein $T_1$ is in the range of about 135° C. to 220° C.

10. The particle mixture composition of claim 1, wherein the first metal comprises Cu and the second metal comprises Sn.

11. The particle mixture composition of claim 10, wherein the first metal further comprise Ag.

12. The particle mixture composition of claim 1, wherein the carrier comprises Bi.

13. The particle mixture composition of claim 12, wherein the carrier comprises Bi and intermetallic species comprise at least one intermetallic species selected from the group consisting of a Sn—Cu intermetallic and a Sn—Ag intermetallic.

14. The particle mixture composition of claim 1, further comprising a metal additive.

15. The particle mixture composition of claim 14, wherein the metal additive is a metal selected from the group consisting of, Al, Fe, Ni, Zn, Ga, Ag, Pd, Pt, Au, In, Sb, Bi, Te, Mn, Co and combinations thereof.

16. The particle mixture composition of claim 14, wherein the metal additive is a particle or a coating.

17. The particle mixture composition of claim 1, further comprising at least one organic vehicle selected from the group consisting of a solvent, a flux, a means to self-inert flux, a thermoplastic polymer and a polymer precursor.

18. The particle mixture composition of claim 17, wherein the flux comprises at least one carboxylic acid, inorganic acid, alkanolamine, phenol or rosin.

19. An interconnected metallurgical network formed by heating the composition of claim 1 to $T_1$, wherein the network comprises:
    a) the intermetallic species of the first metal and the second metal; and
    b) the alloy of the second metal and the carrier, wherein the network is electrically and mechanically stable when subsequently heated to $T_1$.

20. An interconnected metallurgical network formed by heating the composition of claim 1 to $T_1$, wherein the network comprises at least one second metallic particle component selected from the group consisting of: at least one second metal alloy that melts at $T_1$; at least one second metal or alloy thereof that regenerates molten reactive species when the reactive second metal is depleted by reaction with the first reactive metal; and nanoparticles of the second reactive metal; and
    wherein the reaction products comprise:
        c) at least 75 mass % of a thermally stable component that does not melt below 300° C., and
        d) at least 5 mass % of a remelting component that remelts at a temperature $T_2$, wherein $T_2$ is below 220° C.; wherein remelting occurs with consistent energy throughout multiple exposures to a temperature between $T_2$ and 300° C., wherein the remelting component is dispersed throughout the network; and wherein remelting reduces the bulk elastic modulus of the network.

21. The interconnected metallurgical network of claim 20 wherein the reaction products comprise at least 10 mass % of the remelting component.

22. The interconnected metallurgical network of claim 20, wherein the reaction products comprise about 25 mass % of the remelting component.

23. A method for making an electrically and thermally conductive interconnection comprising:
    a) applying an amount of the composition of claim 1 to an assembly of at least two parts, wherein the at least two parts are to be electrically and thermally interconnected;
    b) heating the composition to a temperature $T_1$, wherein $T_1$ is between about 135° C. to 220° C., wherein the first and second metals combine to form at least one intermetallic species.

24. The method of claim 23, wherein substantially all of the first metal is converted to the intermetallic species.

25. The method of claim 23, wherein the intermetallic species are thermally stable metallic components that do not melt below 300° C.

26. The method of claim 25, wherein the method produces a metallic network comprising:
    i) at least 75 mass % of the thermally stable component, and
    ii) at least 5 mass % of a remelting component that remelts at a temperature $T_2$, wherein $T_2$ is below 220° C., and wherein the remelting component is dispersed throughout the network.

27. The method of claim 26, wherein the metallic network comprises at least 10 mass % of the remelting component.

28. The method of claim 26, wherein the metallic network comprises about 25 mass % of the remelting component.

29. The method of claim 26, wherein $T_2$ is below 180° C.

30. The method of claim 26, wherein the $T_2$ is below 150° C.

31. The method of claim 26, further comprising the step of:
    c) heating the network to a temperature between $T_2$ and about 300° C., wherein the remelting component is molten but the thermally stable component is not molten, thereby reducing the bulk elastic modulus of the network.

32. The method of claim 31, wherein the at least two parts have different CTEs than the interconnection.

33. A particle mixture composition comprising:
    a) between about 35 mass % and about 60 mass % of a first metallic particle component comprising a first metal, based on the total mass of metal particles in the composition;
    b) a second metallic particle component comprising a second metal that forms intermetallic species with the first metal at temperature $T_1$, wherein the intermetallic species have a minimum melting temperature not less than 10° C. above $T_1$,
    wherein:
        i) the second metallic particle component comprises an excess of the second metal over the amount required to completely convert all of the first metal to the intermetallic species, and
        ii) the second metallic particle component comprises at least about 10 mass % of a first alloy of the second metal and a carrier, that is molten at $T_1$,
    wherein the second metallic particle component further comprises at least one additional alloy of the second metal with the proviso that the at least one additional alloy is either molten at $T_1$ or is soluble in the first alloy at $T_1$.

34. The particle mixture composition of claim 33, wherein the second metallic particle component comprises a plurality of alloys of the second metal, with the proviso that each alloy of the second metal is either molten at $T_1$ or is soluble in the first alloy at $T_1$.

35. A particle mixture composition comprising:
    a) between about 35 mass % and about 60 mass % of a first metallic particle component comprising a first metal, based on the total mass of metal particles in the composition;
    b) a second metallic particle component comprising a second metal that forms intermetallic species with the first metal at temperature $T_1$, wherein the intermetallic species have a minimum melting temperature not less than 10° C. above $T_1$, wherein:
- i) the second metallic particle component comprises an excess of the second metal over the amount required to completely convert all of the first metal to the intermetallic species, and
- ii) the second metallic particle component comprises at least about 10 mass % of a first alloy of the second metal and a carrier, that is molten at $T_1$, and further comprising a metal additive, wherein the metal additive is a nanoparticle.

* * * * *